(12) United States Patent
Tsai et al.

(10) Patent No.: US 9,558,946 B2
(45) Date of Patent: Jan. 31, 2017

(54) FINFETS AND METHODS OF FORMING FINFETS

(71) Applicant: Taiwan Semiconductor Manufacturing Company, Ltd., Hsin-Chu (TW)

(72) Inventors: Chun Hsiung Tsai, Xinpu Township (TW); Tsan-Chun Wang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/506,348

(22) Filed: Oct. 3, 2014

(65) Prior Publication Data

US 2016/0099150 A1 Apr. 7, 2016

(51) Int. Cl.
| | |
|---|---|
| *H01L 21/223* | (2006.01) |
| *H01L 21/336* | (2006.01) |
| *H01L 29/66* | (2006.01) |
| *H01L 29/78* | (2006.01) |
| *H01L 21/02* | (2006.01) |
| *H01L 21/225* | (2006.01) |
| *H01L 21/3115* | (2006.01) |

(52) U.S. Cl.
CPC ..... *H01L 21/2236* (2013.01); *H01L 21/02362* (2013.01); *H01L 21/02694* (2013.01); *H01L 21/2252* (2013.01); *H01L 21/31155* (2013.01); *H01L 29/66795* (2013.01); *H01L 29/785* (2013.01)

(58) Field of Classification Search
CPC .................. H01L 21/31111; H01L 21/823431; H01L 21/76224; H01L 21/265; H01L 27/088; H01L 21/823481; H01L 29/7853; H01L 21/823821; H01L 27/0924; H01L 21/845; H01L 29/7854; H01L 29/66818; H01L 29/06; H01L 29/78; H01L 27/1211; H01L 21/2236; H01L 21/31155; H01L 21/2252; H01L 21/02694; H01L 21/02362
USPC .................................. 257/288, 401; 438/400
See application file for complete search history.

(56) References Cited

U.S. PATENT DOCUMENTS

| | | | |
|---|---|---|---|
| 2004/0256683 A1 | 12/2004 | Lee et al. | |
| 2007/0166846 A1* | 7/2007 | Sasaki ............... | H01J 37/32412 438/14 |
| 2010/0176424 A1* | 7/2010 | Yeo ................... | H01L 21/26586 257/255 |
| 2011/0171795 A1* | 7/2011 | Tsai .................. | H01L 21/26513 438/232 |

(Continued)

FOREIGN PATENT DOCUMENTS

| | | |
|---|---|---|
| KR | 20040110817 A | 12/2004 |
| KR | 20120020062 A | 3/2012 |

(Continued)

*Primary Examiner* — Thomas L Dickey
*Assistant Examiner* — Changhyun Yi
(74) *Attorney, Agent, or Firm* — Slater Matsil, LLP

(57) ABSTRACT

An embodiment is a method including forming a fin on a substrate, forming a first doped region in a top portion of the fin, the first doped region having a first dopant concentration, and forming a second doped region in a middle and bottom portion of the fin, the second doped region having a second dopant concentration, the second dopant concentration being less than the first dopant concentration.

20 Claims, 29 Drawing Sheets

(56) References Cited

U.S. PATENT DOCUMENTS

| | | |
|---|---|---|
| 2012/0052664 A1 | 3/2012 | Fuse et al. |
| 2013/0115763 A1 | 5/2013 | Takamure et al. |
| 2013/0285143 A1 | 10/2013 | Oh et al. |
| 2014/0264575 A1 | 9/2014 | Tsai et al. |

FOREIGN PATENT DOCUMENTS

| | | |
|---|---|---|
| KR | 20120128531 A | 11/2012 |
| KR | 20130049752 A | 5/2013 |
| KR | 20130120201 A | 11/2013 |
| KR | 20140112363 A | 9/2014 |

\* cited by examiner

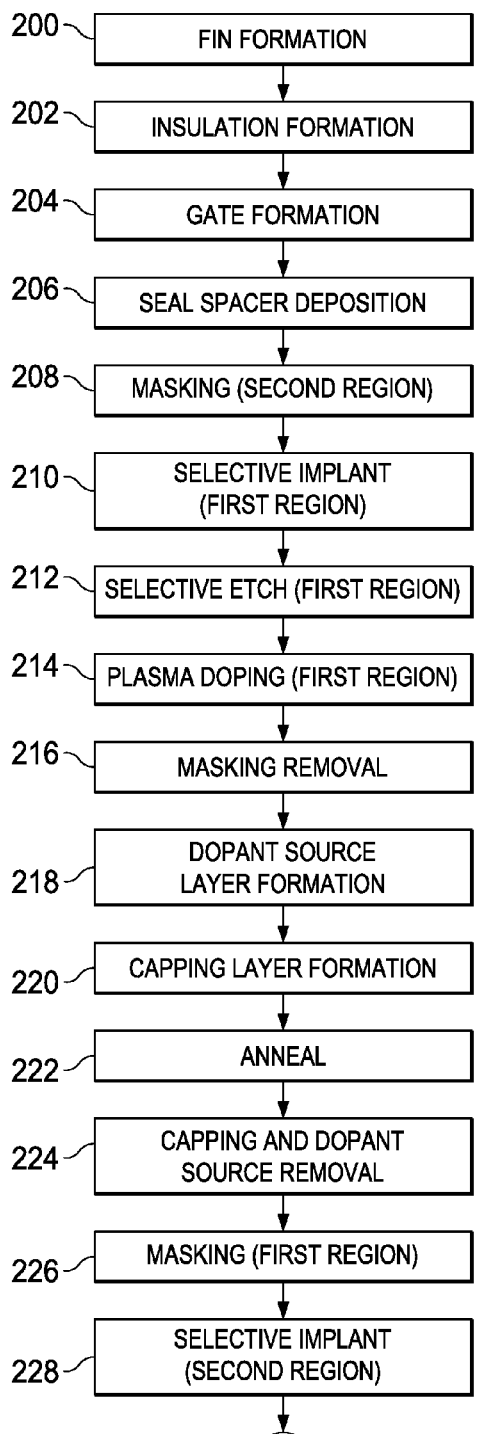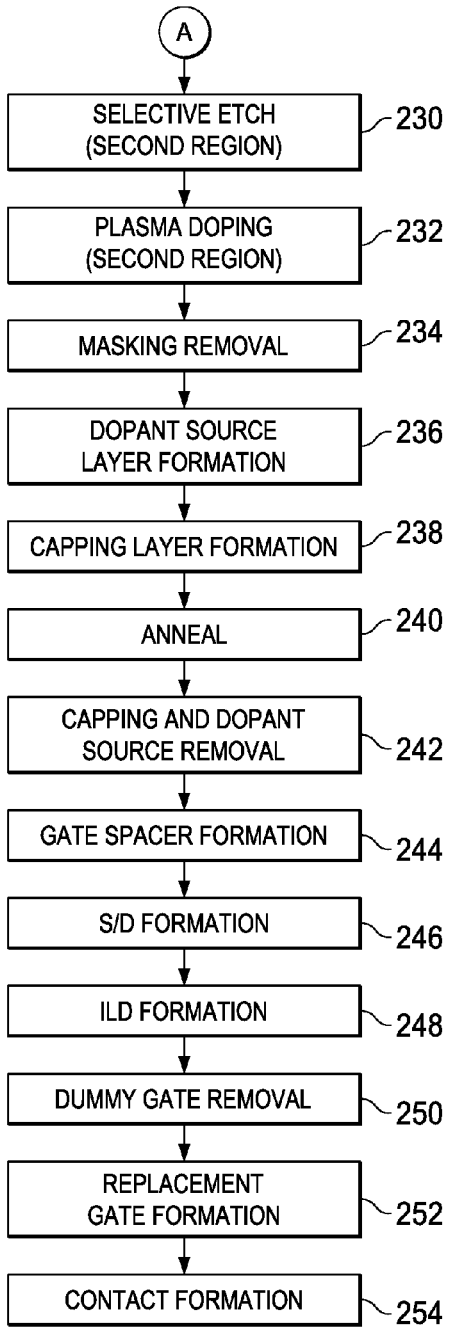
FIG. 14A
FIG. 14B

FINFETS AND METHODS OF FORMING FINFETS

BACKGROUND

Semiconductor devices are used in a large number of electronic devices, such as computers, cell phones, and others. Semiconductor devices comprise integrated circuits that are formed on semiconductor wafers by depositing many types of thin films of material over the semiconductor wafers, and patterning the thin films of material to form the integrated circuits. Integrated circuits typically include field-effect transistors (FETs).

Conventionally, planar FETs have been used in integrated circuits. However, with the ever increasing density and decreasing footprint requirements of modern semiconductor processing, planar FETs may generally incur problems when reduced in size. Some of these problems include sub-threshold swing degradation, significant drain induced barrier lowering (DIBL), fluctuation of device characteristics, and leakage. Fin field-effect transistors (FinFETs) have been studied to overcome some of these problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 14A and 14B are a process flow of a process in accordance with some embodiments.

DETAILED DESCRIPTION

Figure 1:
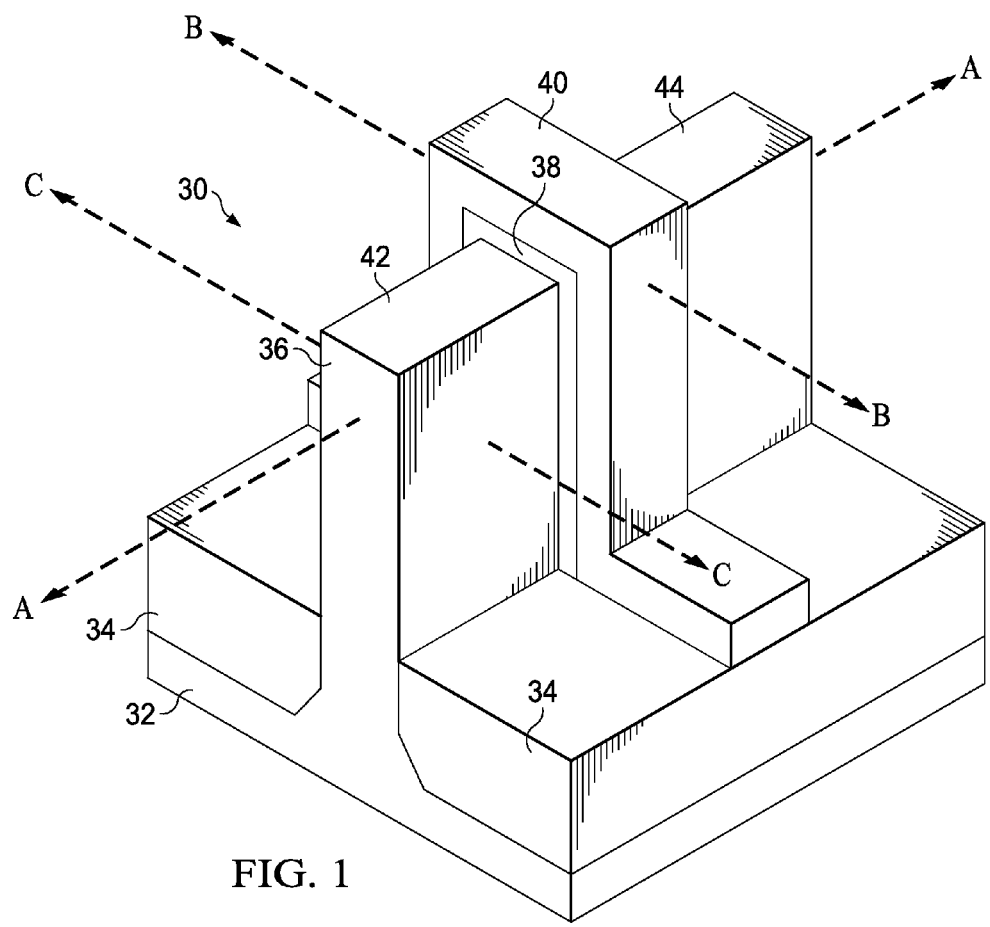
FIG. 1 is an example of a Fin Field-Effect Transistor (FinFET) in a three-dimensional view.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Fin Field-Effect Transistors (FinFETs) and methods of forming the same are provided in accordance with various embodiments. Intermediate stages of forming FinFETs are illustrated. Some embodiments discussed herein are discussed in the context of FinFETs formed using a gate-last process. In other embodiments, a gate-first process may be used. Also, some embodiments contemplate aspects used in planar devices, such as planar FETs. Some variations of the embodiments are discussed. One of ordinary skill in the art will readily understand other modifications that may be made that are contemplated within the scope of other embodiments. Although method embodiments are discussed in a particular order, various other method embodiments may be performed in any logical order and may include fewer or more steps described herein.

FIG. 1 illustrates an example of a FinFET 30 in a three-dimensional view. The FinFET 30 comprises a fin 36 on a substrate 32. The substrate 32 includes isolation regions 34, and the fin 36 protrudes above and from between neighboring isolation regions 34. A gate dielectric 38 is along sidewalls and over a top surface of the fin 36, and a gate electrode 40 is over the gate dielectric 38. Source/drain regions 42 and 44 are disposed in opposite sides of the fin 36 with respect to the gate dielectric 38 and gate electrode 40. FIG. 1 further illustrates reference cross-sections that are used in later figures. Cross-section A-A is along a longitudinal axis of the fin 36 and in a direction of, for example, a current flow between the source/drain regions 42 and 44. Cross-section B-B is perpendicular to cross-section A-A and across a channel, gate dielectric 38, and gate electrode 40 of the FinFET 30. Cross-section C-C is parallel to cross-section B-B and across a source/drain region. Subsequent figures refer to these reference cross-sections for clarity.

FIGS. 2A through 13C are cross-sectional views of intermediate stages in the manufacturing of FinFETs in accordance with an exemplary embodiment, and FIGS. 14A and 14B are a process flow of the process shown in FIGS. 2 through 13C. In FIGS. 2A through 13C, Figures ending with an "A" designation are illustrated along cross-section A-A illustrated in FIG. 1; figures ending with a "B" designation are illustrated along a similar cross-section B-B; and figures ending with a "C" designation are illustrated along a similar cross-section C-C, except for multiple FinFETs.

Figure 2A:
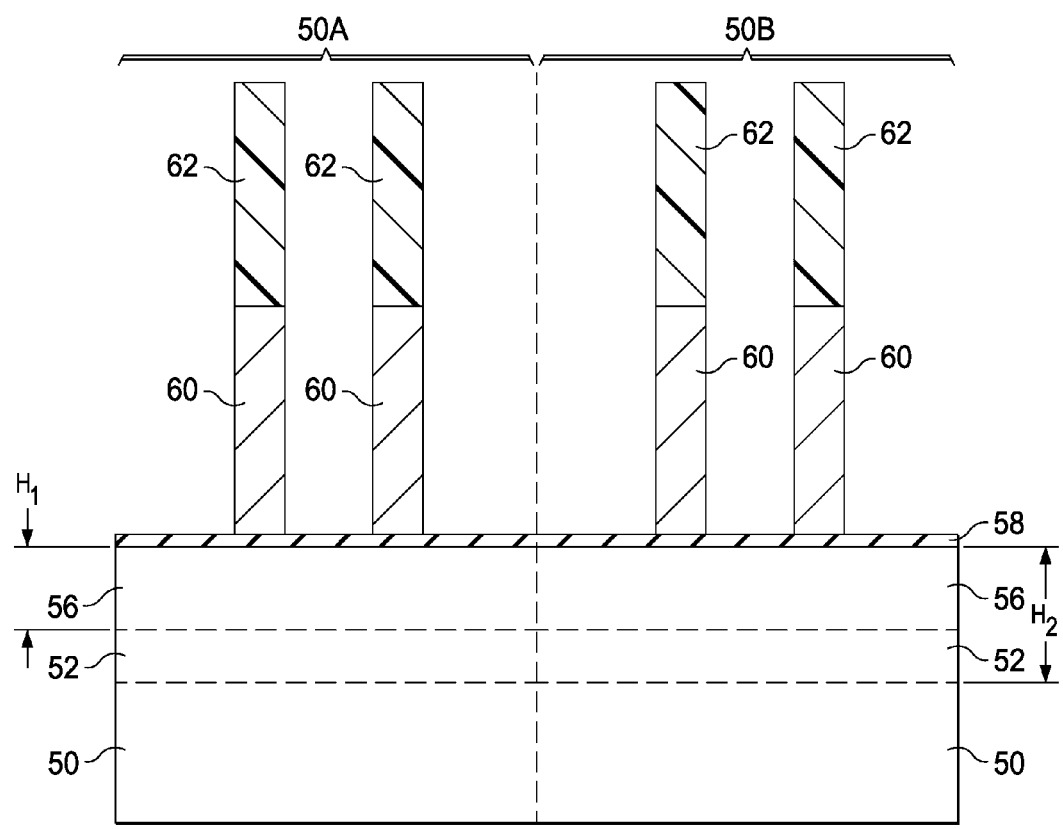
FIGS. 2A-C, 3A-C, 4A-C, 5A-C, 6A-C, 7A-C, 8A-D, 9A-C, 10A-C, 11A-C, 12A-D, and 13A-13C are cross-sectional views of intermediate stages in the manufacturing of FinFETs in accordance with some embodiments.
Figure 2B:
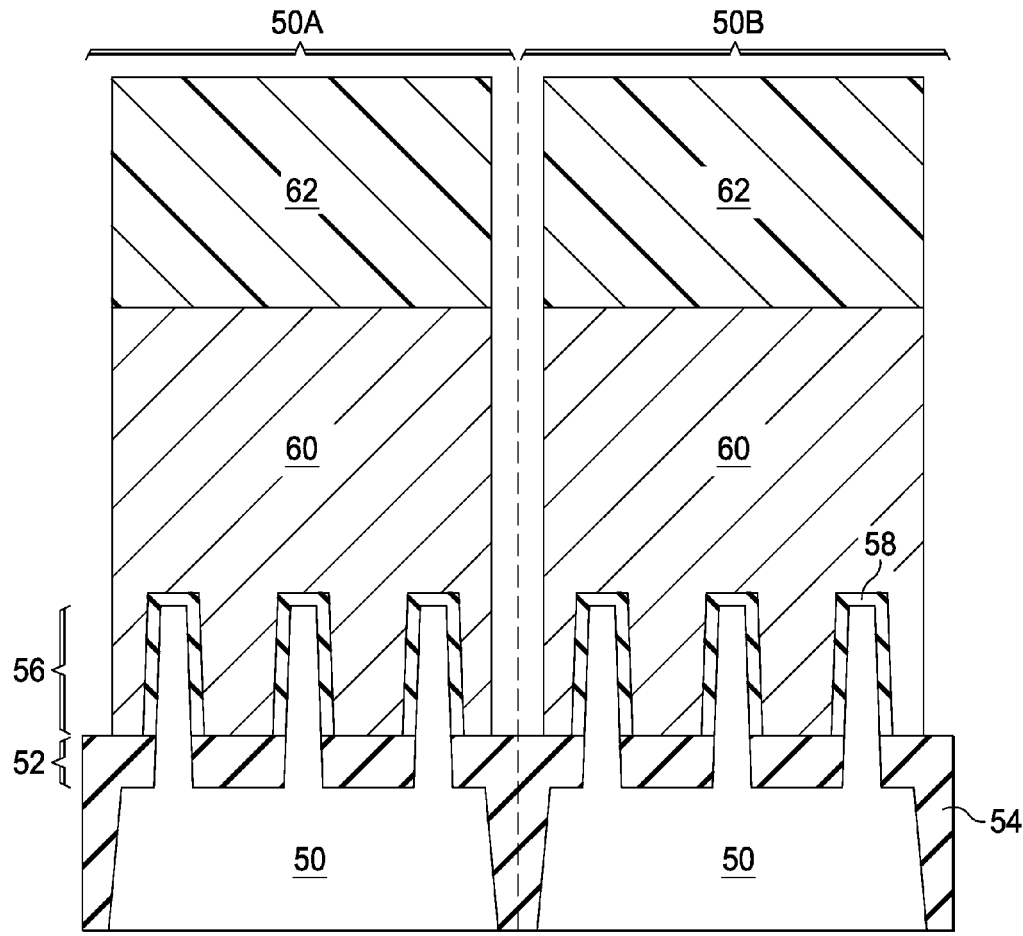
Figure 2C:
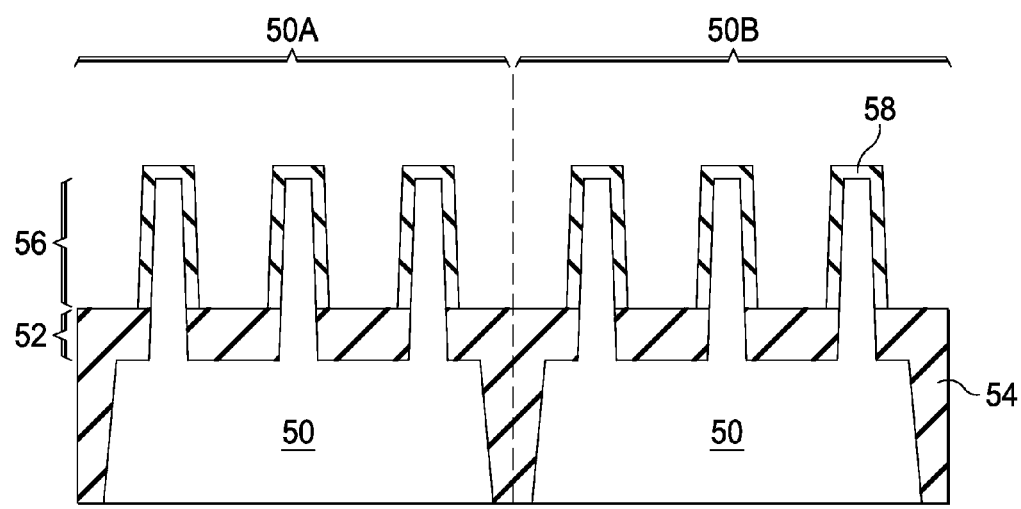

FIGS. 2A, 2B, and 2C illustrate a substrate 50, semiconductor strips 52, isolation regions 54, gate electrodes 60, and mask layer 62. Substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate comprises a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a first region 50A and a second region 50B. The first region 50A can be for forming n-type devices, such as NMOS transistors, such as n-type FinFETs. The second region 50B can be for forming p-type devices, such as PMOS transistors, such as p-type FinFETs.

In steps 200 and 202, the semiconductor strips 52, isolation regions 54, and fins 56 are formed over the substrate 50. The isolation regions 54 extend from a top surface of the substrate 50 into the substrate 50. The isolation regions 54 may be shallow trench isolation (STI) regions, and are referred to as STI regions 54 hereinafter. The formation of the STI regions 54 may include etching the substrate 50 to form trenches (not shown), and filling the trenches with a dielectric material to form the STI regions 54. The STI regions 54 may be formed of an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. The portion of substrate 50 between neighboring STI regions 54 is referred to as a semiconductor strips 52 throughout the description. The top surfaces of the semiconductor strips 52 and the top surfaces of the STI regions 54 may be substantially level with each other, such as by performing a chemical mechanical polish (CMP) after depositing the material of the STI regions 54, although the surfaces may be at slightly different levels.

The STI regions 54 may then be recessed have portions of the semiconductor strips 52 extend above the top surfaces of the STI regions 54. The protruding portions of the semiconductor strips 52 will be referred to as fins 56 hereinafter. In some embodiments, the fins 56 have a height $H_1$ from top surfaces of the fins 56 to top surfaces of the STI regions, and the fins 56 and the semiconductor strips 52 have a combined height $H_2$ from top surfaces of the fins 56 to top surfaces of the substrate 50 (e.g. at the bottom of the STI regions 54). In an embodiment, the height $H_1$ is from about 20 nm to about 40 nm, and the height $H_2$ is from about 40 nm to about 60 nm.

A person having ordinary skill in the art will readily understand that the process described with respect to FIGS. 2A through 2C is just one example of how fins 56 may be formed. In other embodiments, a dielectric layer can be formed over a top surface of the substrate 50; trenches can be etched through the dielectric layer; homoepitaxial structures can be epitaxially grown in the trenches; and the dielectric layer can be recessed such that the homoepitaxial structures protrude from the dielectric layer to form fins. In still other embodiments, heteroepitaxial structures can be used for the fins. For example, the fins 56 in FIGS. 2A through 2C can be recessed, and a material different from the fins 56 may be epitaxially grown in their place. In an even further embodiment, a dielectric layer can be formed over a top surface of the substrate 50; trenches can be etched through the dielectric layer; heteroepitaxial structures can be epitaxially grown in the trenches using a material different from the substrate 50; and the dielectric layer can be recessed such that the heteroepitaxial structures protrude from the dielectric layer to form fins. In some embodiments where homoepitaxial or heteroepitaxial structures are epitaxially grown, the grown materials may be in situ doped during growth, which may obviate prior implanting of the fins although in situ and implantation doping may be used together. Still further, it may be advantageous to epitaxially grow a material in an NMOS region different from the material in a PMOS region. In various embodiments, the fins 56 may comprise silicon germanium ($Si_xGe_{1-x}$, where x can be between approximately 0 and 100), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

In step 204, a gate structure is formed over the fins 56 and the STI regions 54. The gate structure includes a gate dielectric layer 58 and a gate electrode 114 with a mask layer 62 over the gate electrode 60. The gate structure crosses over a plurality of the fins 56 and the STI regions 54. The gate structure has a longitudinal axis that is substantially perpendicular to the longitudinal axes of fins 56. In some embodiments, the gate structure is a dummy gate structure and will be replaced with a replacement gate structure using a "gate-last" or replacement-gate process. In other embodiments, the gate structure is an active gate and is formed in a "gate-first process" and will not be replaced.

Figure 6A:
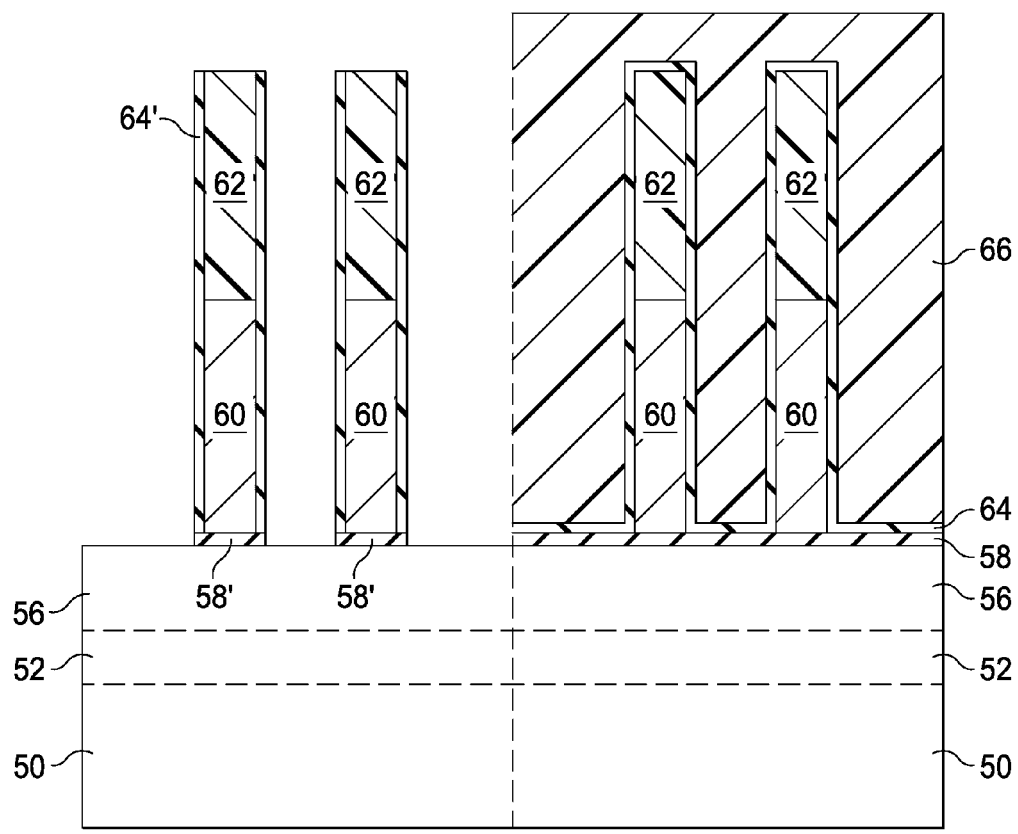
Figure 6B:
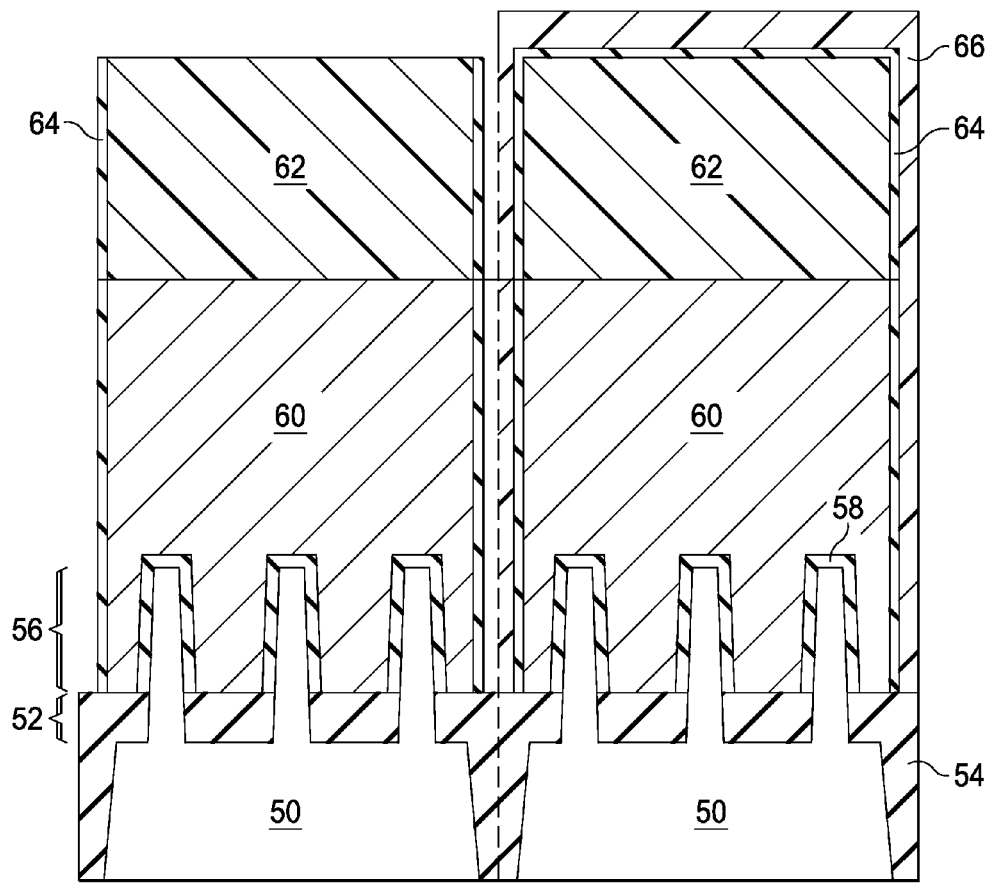
Figure 6C:
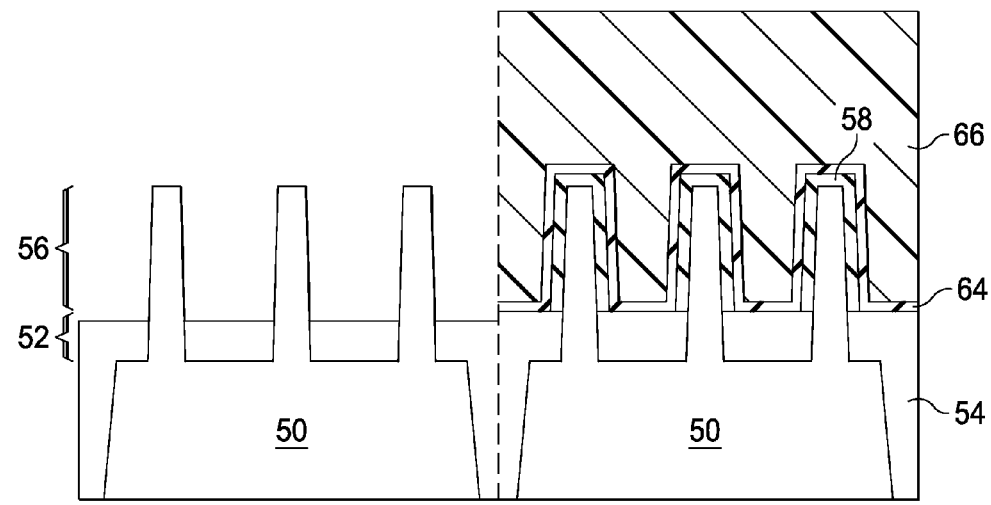

A gate dielectric layer 58 may be formed and patterned to form the gate dielectric 58' (see FIGS. 6A, 6B, and 6C). The gate dielectric layer 58 may be formed over the fins 56 and the STI regions 54 by thermal oxidation, in-situ steam generation (ISSG) process, chemical vapor deposition (CVD), a spin-on-glass process, sputtering, or any other methods known and used in the art for forming a gate dielectric layer. In some embodiments, the gate dielectric layer 58 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the gate dielectric layer 58 is formed, a gate electrode 60 is formed over the gate dielectric layer. The gate electrode 60 may be formed by first forming a gate electrode layer (not shown) over the fins 56 and the STI regions 54 and then patterning the gate electrode layer to form the gate electrode 60. In some embodiments, the gate electrode layer is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the gate electrode layer includes a metal-containing material such as TiN, TaN, TaC, Co, Ru, Al, combinations thereof, or multi-layers thereof. The gate electrode layer may be deposited by CVD, physical vapor deposition (PVD), sputter deposition, or other techniques known and used in the art for depositing conductive materials. The top surface of the gate electrode layer may have a non-planar top surface and may be planarized by, for example, performing a CMP process after it is deposited. The mask layer 62—such as a photoresist, hard mask, combinations thereof, or multi-layers thereof—may be formed and patterned over the gate electrode layer. The patterned mask layer 62 may then be transferred to the material of the gate electrode layer using acceptable photolithography and etching techniques to form the gate electrode 60.

Figure 3A:
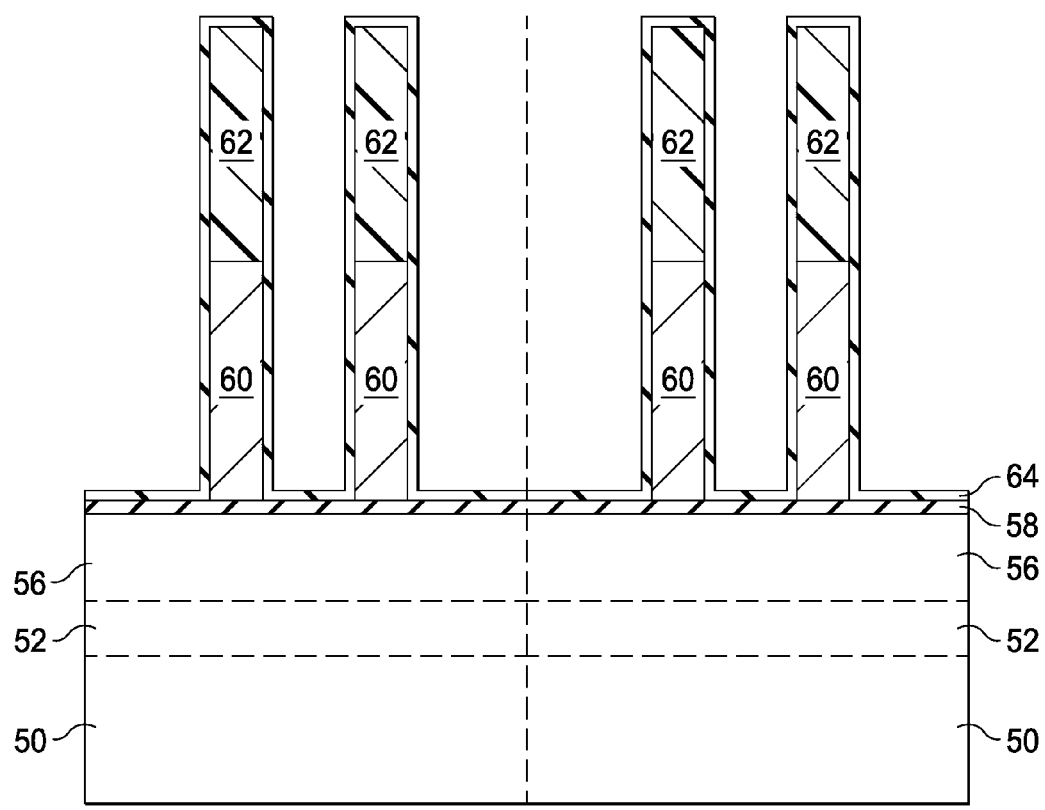
Figure 3B:
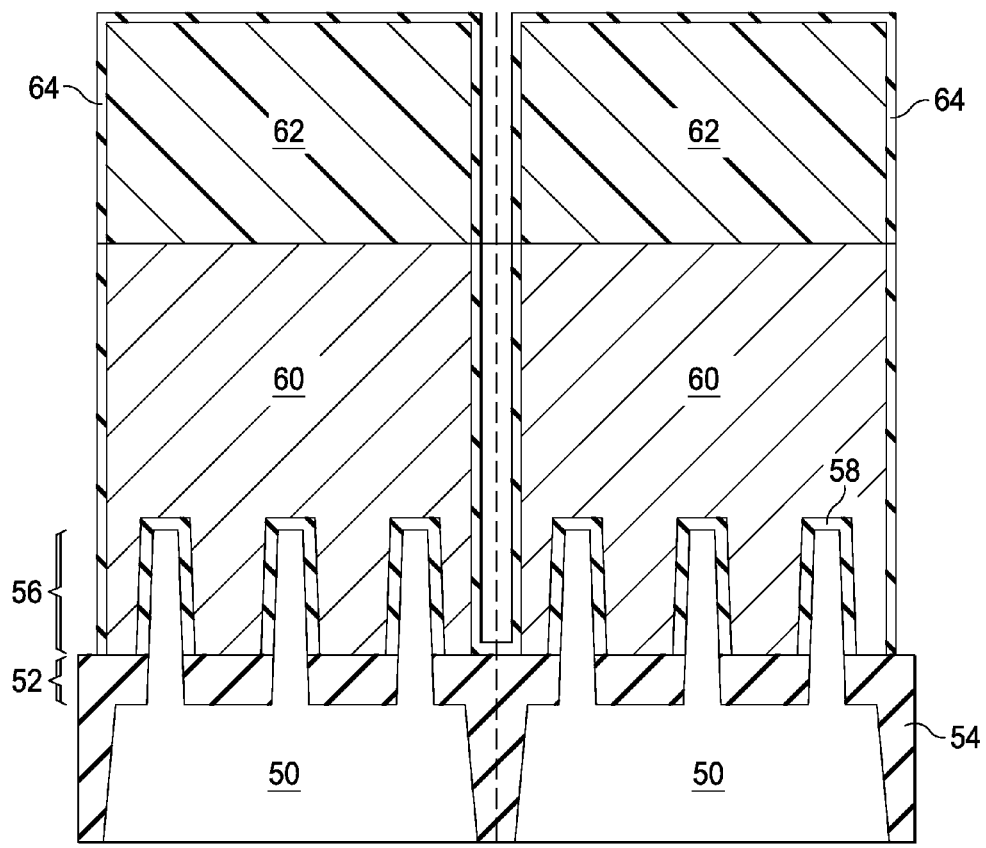
Figure 3C:
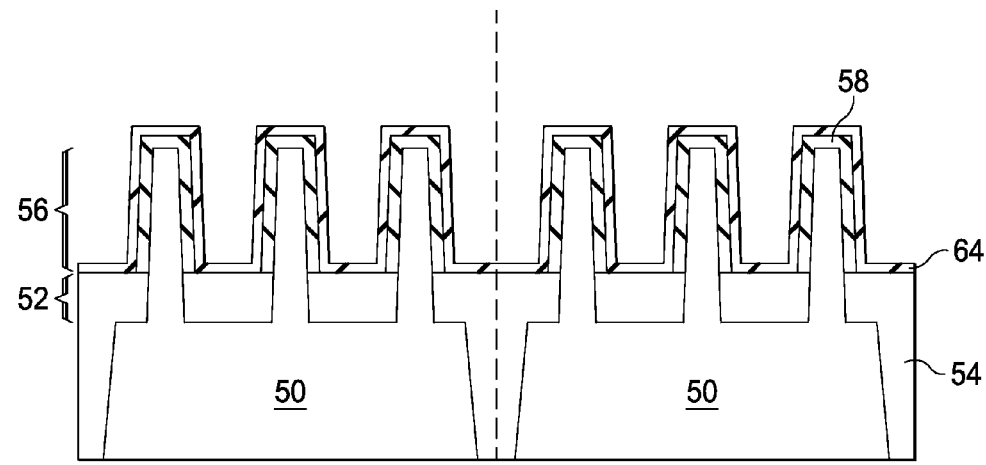

In FIGS. 3A, 3B, and 3C and step 206, a seal spacer layer 64 is formed on the exposed surfaces of the gate electrodes 60, mask layers 62, on the gate dielectric layer 58 over the fins 56, and on top surfaces of the STI regions 54. The seal spacer layer 64 may be formed of an oxide, nitride, SiC, SiCN, the like, or a combination thereof by an oxidation process, CVD, the like, or a combination thereof.

Figure 4A:
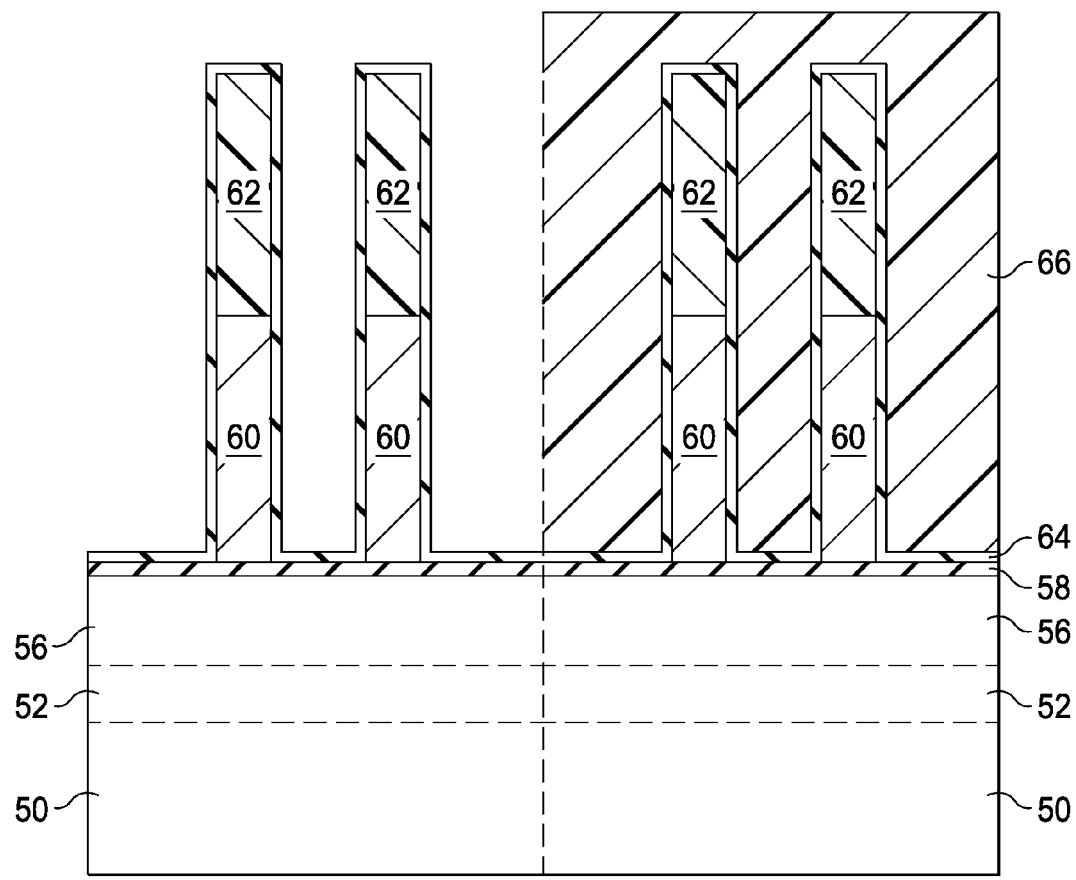
Figure 4B:
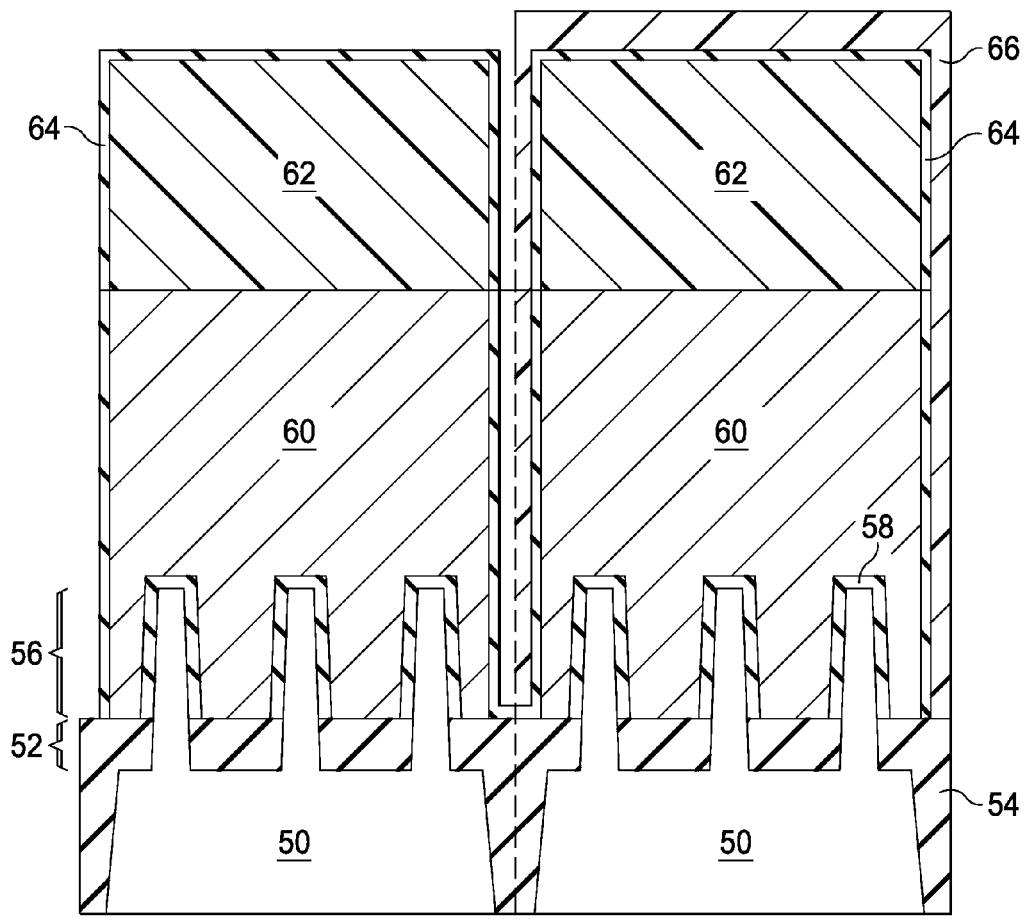
Figure 4C:
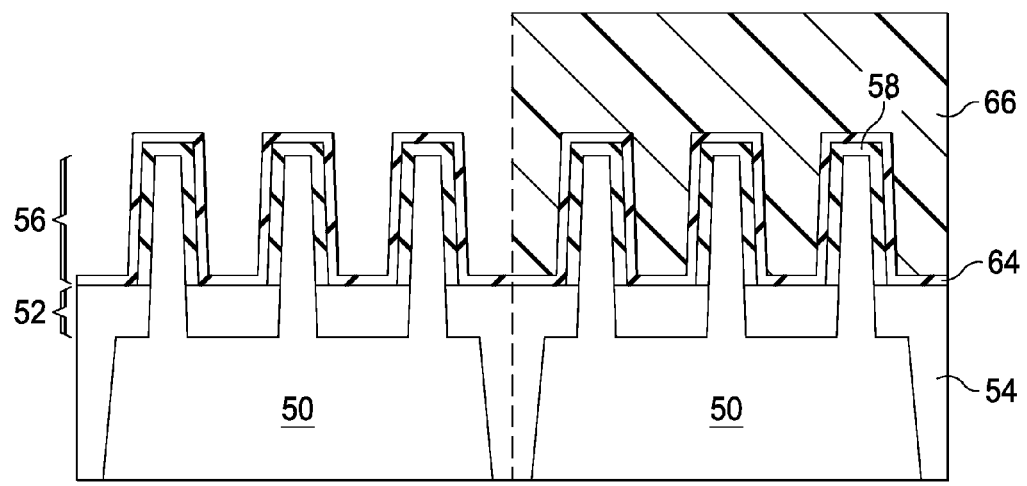

In FIGS. 4A, 4B, and 4C and step 208, a mask 66 is formed over the second region 50B of the substrate 50 while the first region 50A is exposed. The mask protects the second region 50B during subsequent processing of the first region 50A. The mask 66 may be a photoresist, a hard mask, such as SiN, the like, or a combination thereof. The mask 66 is then patterned by an acceptable photolithography process or the like.

Figure 5A:
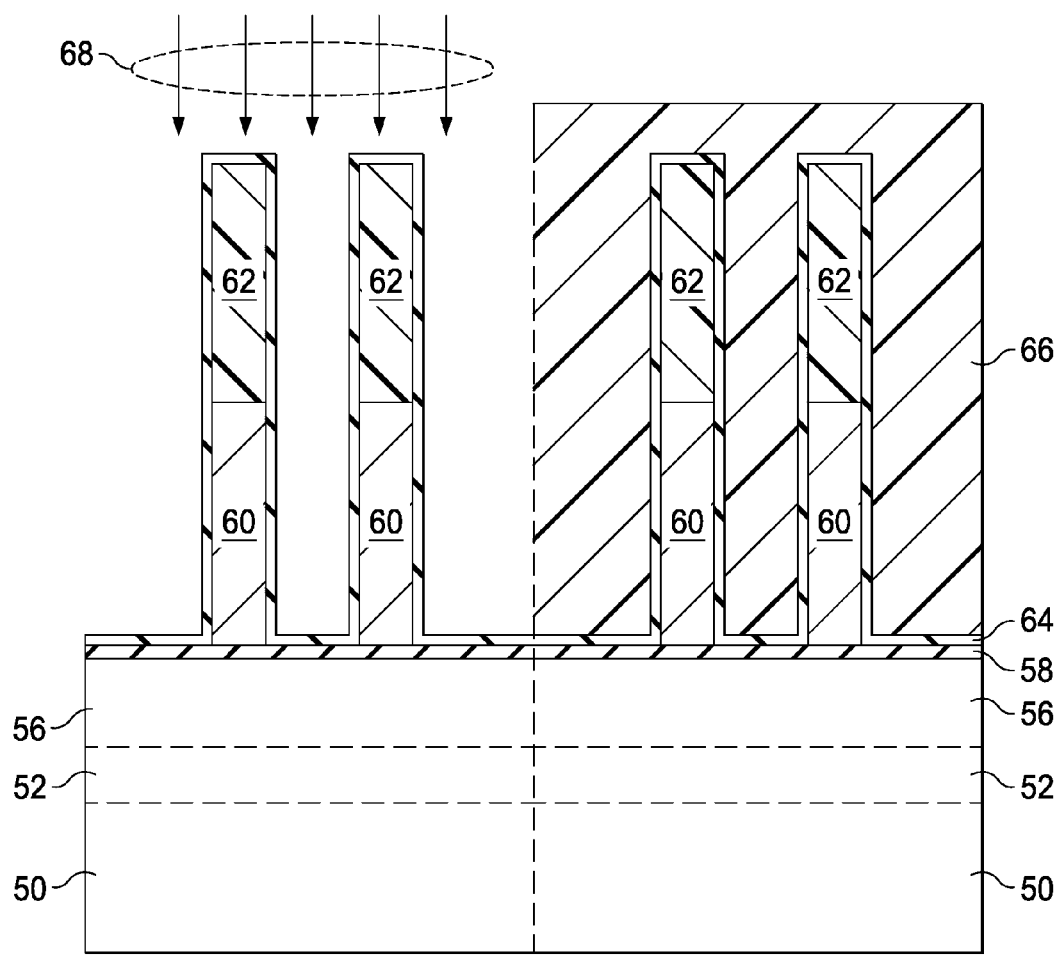
Figure 5B:
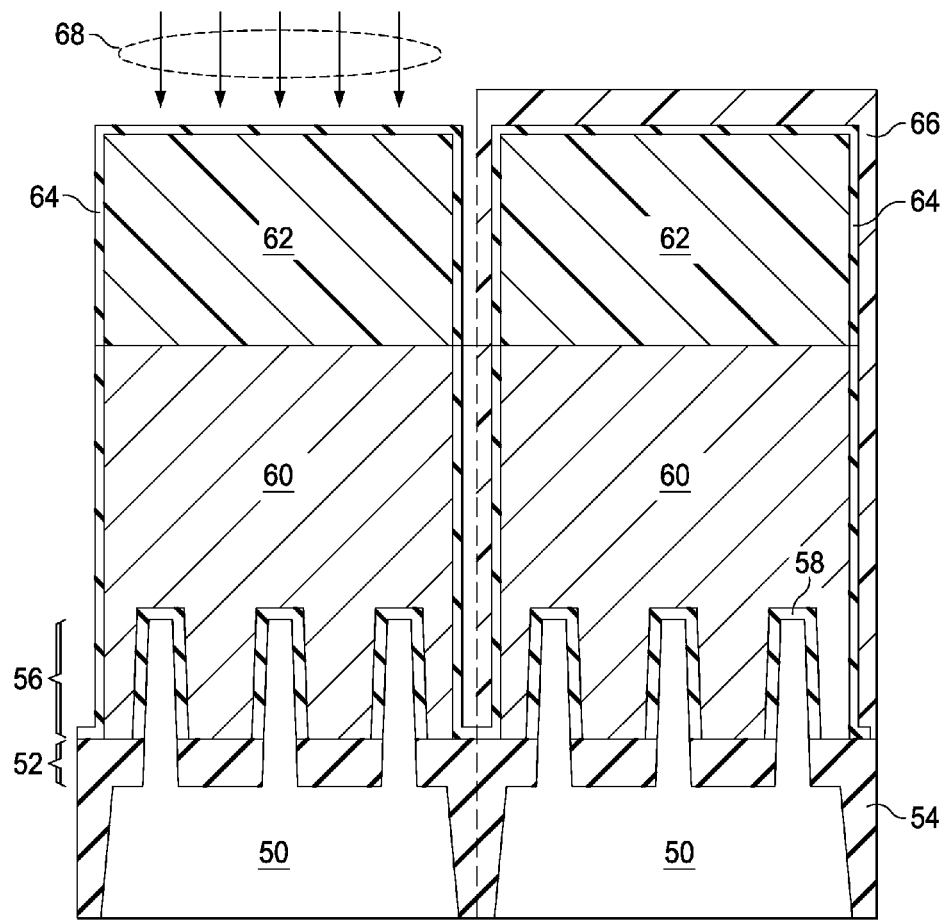
Figure 5C:
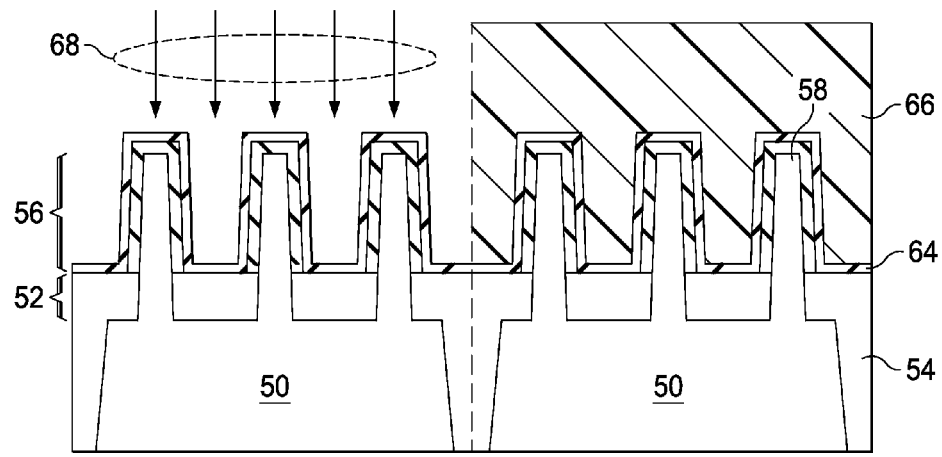

In FIGS. 5A, 5B, and 5C and step 210, a selective implant process 68 is performed on the first region 50A of the substrate 50. The selective implant process 68 changes the properties of the seal spacer layer 64 to allow a selective etch of the seal spacer layer 64 to remove portions of the seal spacer layer 64 while other portions of the seal spacer layer 64 remain. In an embodiment, the selective implant process 68 includes implanting oxygen, fluorine, the like, or a combination thereof. In an embodiment, the implanted region of the seal spacer layer 64 has a higher etch rate than the non-implanted region of the seal spacer layer 64. In some embodiments, the selective implant process 68 is performed at an angle substantially perpendicular to a major surface of the substrate 50 such that the horizontal surfaces (i.e., surfaces that are substantially parallel to the major surface of the substrate 50) of the seal spacer layer 64 are implanted during the selective implant process 68 while the vertical surfaces (i.e., surfaces that are substantially perpendicular to the major surface of the substrate 50) of the seal spacer layer 64 are not implanted.

In FIGS. 6A, 6B, and 6C and step 212, a selective etch process is performed on the seal spacer layer 64 and the gate dielectric layer 58 in the first region 50A of the substrate 50 to form seal spacers 64' and gate dielectric 58' in the first region 50A. The seal spacers 64' are formed on sidewalls of the gate electrodes 60 and mask layers 62 in the first region 50A. In an embodiment, the process gas of the selective etch includes $CF_4$, $O_2$, and HBr, the like, or a combination thereof.

Figure 7A:
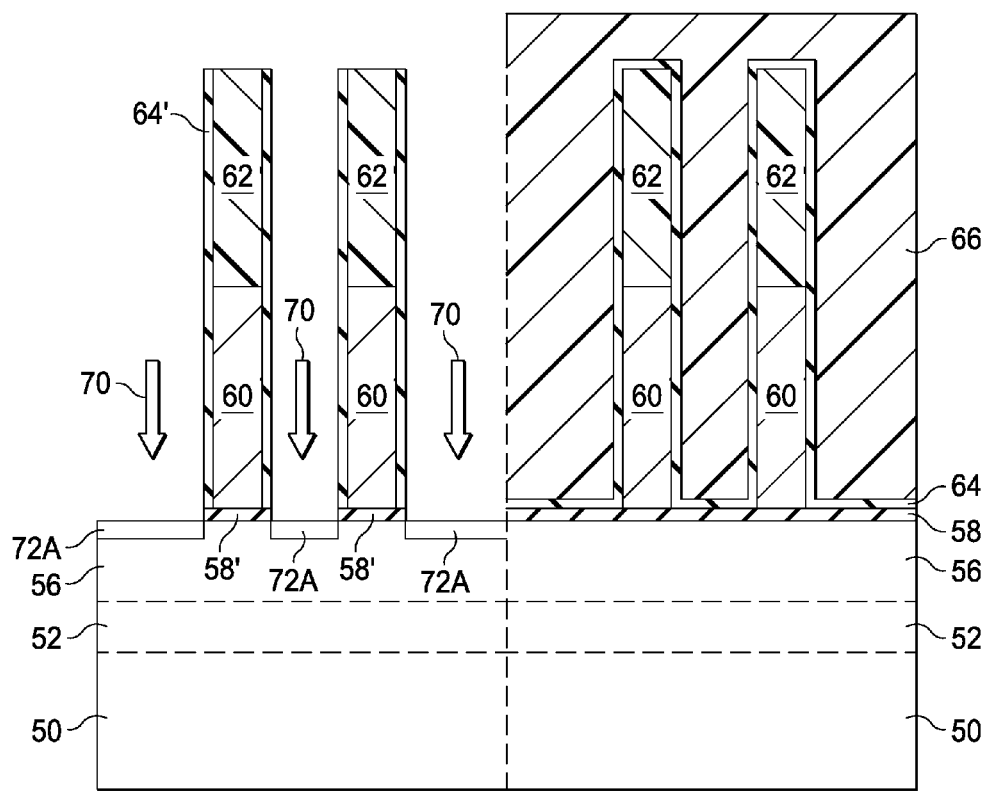
Figure 7B:
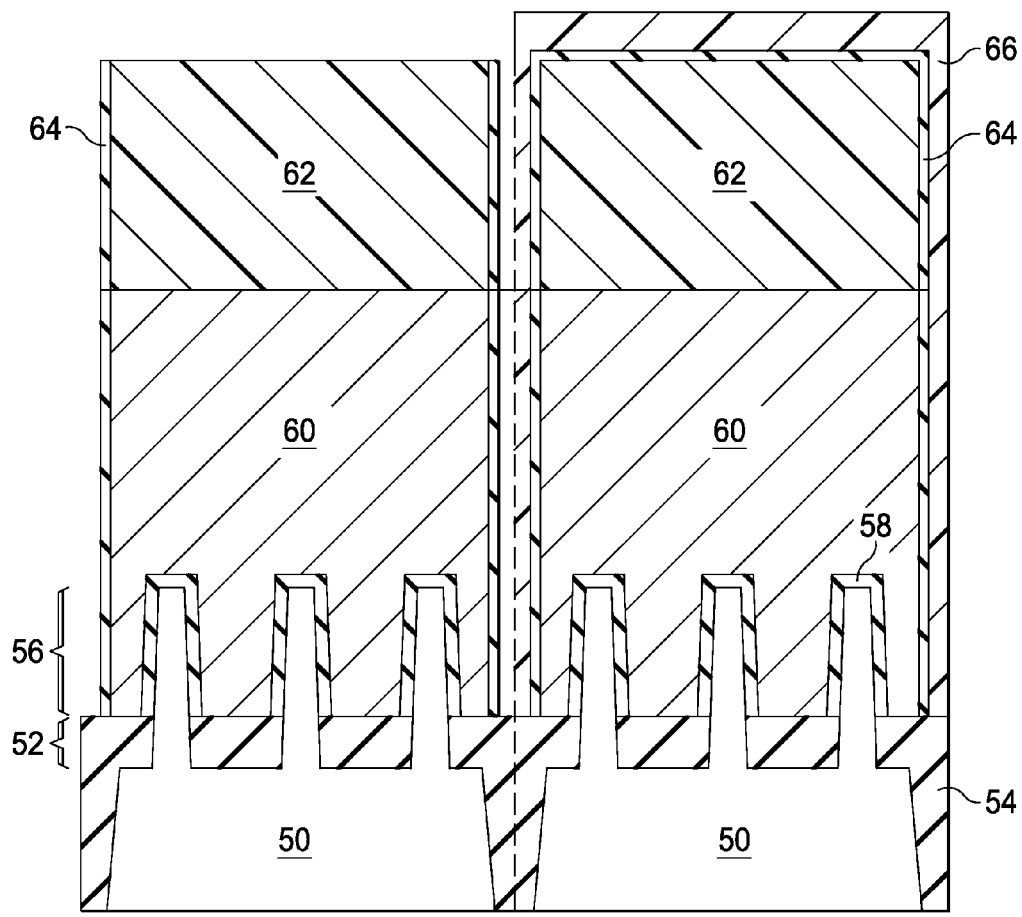
Figure 7C:
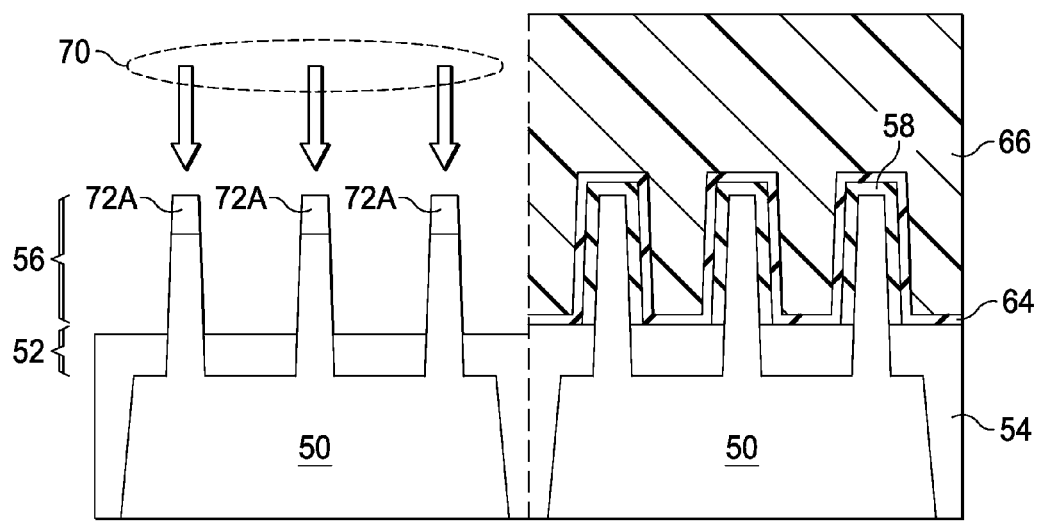

In FIGS. 7A, 7B, and 7C and step 214, a plasma doping process 70 is performed on the first region 50A of the substrate 50 to form first doped regions 72A in the fins 56. The plasma doping process 70 implants n-type dopants (e.g. P, As, etc.) to form lightly doped drain (LDD) regions. By utilizing a plasma doping process, as opposed to a beam line implant process, the present disclosure can have a highly doped top portion of the fins 56 without the defects (e.g. twin boundary defects) caused by a beam line implant process. In an embodiment, the plasma doping process 70 is performed in the first region 50A of the substrate 50 utilizes from about 0.1% to about 0.9% of $AsH_3$ or $PH_3$/He, and from about 99.1% to about 99.9% $H_2$. In an embodiment, the plasma doping process 70 is performed at a constant energy of between about 0.2 kiloelectron-volts (keV) and about 5 keV. After the plasma doping process 70, the first doped regions 72A have a dopant concentration of As/P in a range from about 1E20 atoms/cm³ to about 3E21 atoms/cm³. The plasma doping process 70 can form an abrupt doping profile junction at a depth of from about 5 nm to about 10 nm from surfaces of the fin 56 with a doping profile abruptness of about 1 nm/decade.

Figure 8A:
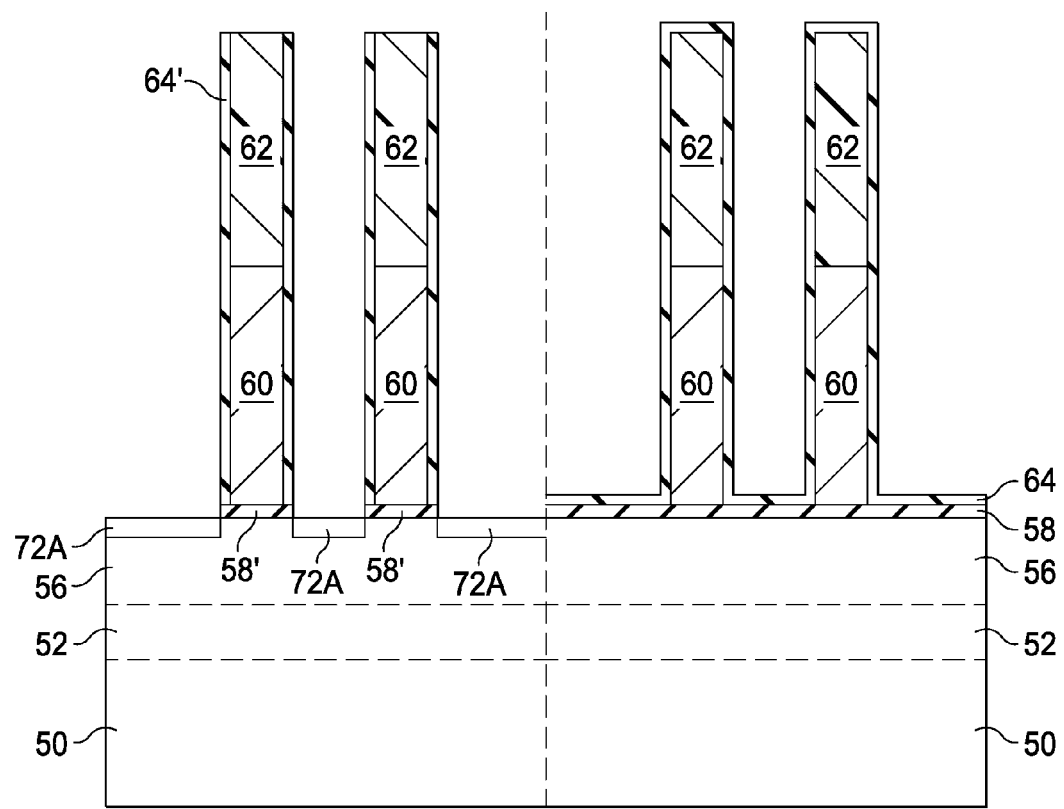
Figure 8B:
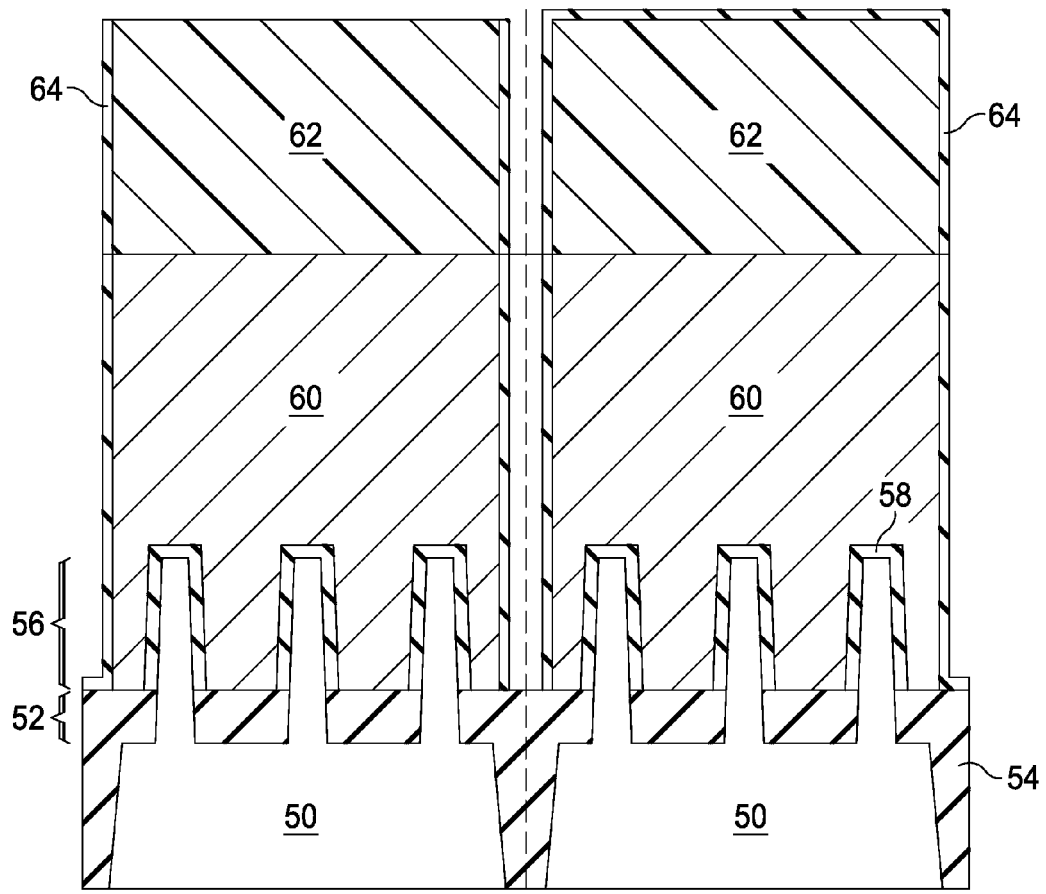
Figure 8C:
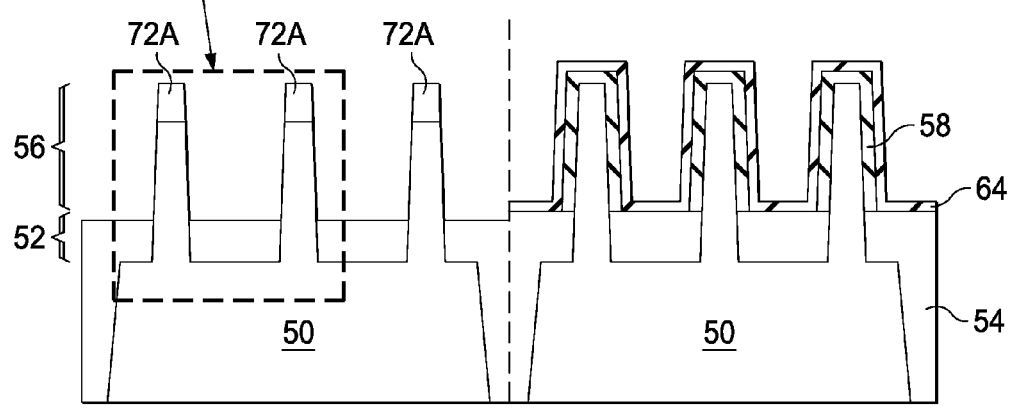
Figure 8D:
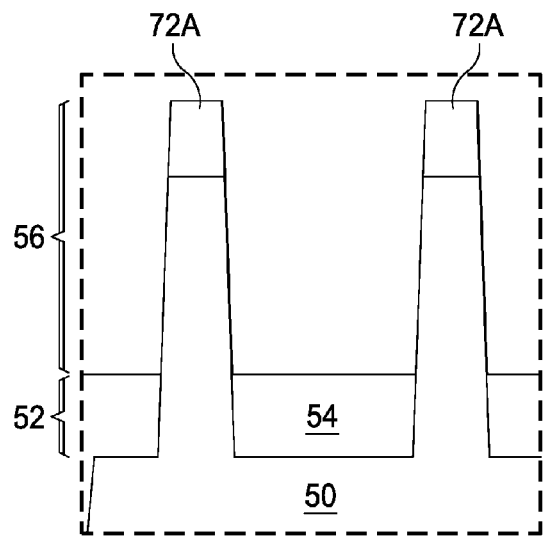

In FIGS. 8A, 8B, and 8C and step 216, the mask 66 is removed such that the seal spacer layer 64 in the second region 50B is exposed. For example, if the mask 66 is a photoresist, the mask 66 may be removed by an appropriate ashing process, such as using an oxygen plasma. In other embodiments, the mask 66 may be removed using an etch, a CMP process, the like, or a combination thereof. In an embodiment, the mask 66 may be removed by a etch process utilizing $CF_4$, $O_2$, and HBr, the like, or a combination thereof. FIG. 8D illustrates a close-up view of the fins 56 and the first poped regions 72A from FIG. 8C. The first doped regions 72A are located in top portions (tips) of the fins 56.

Figure 9A:
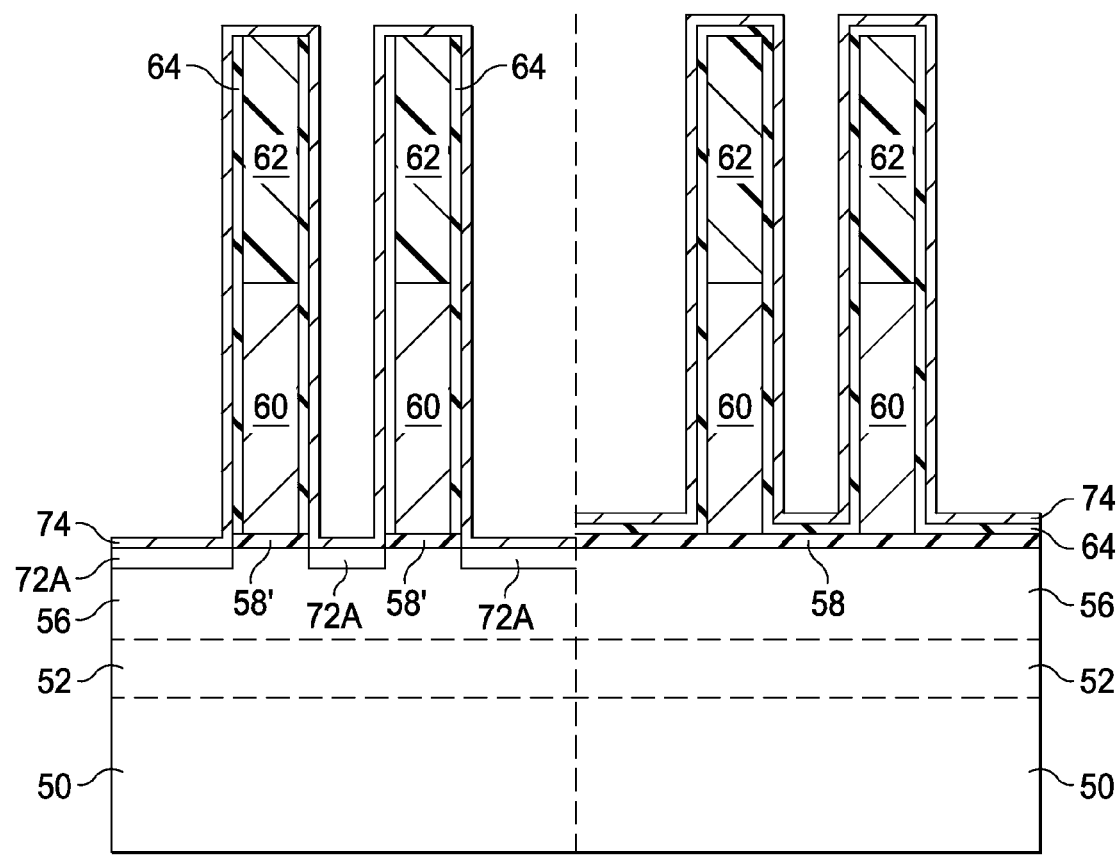
Figure 9B:
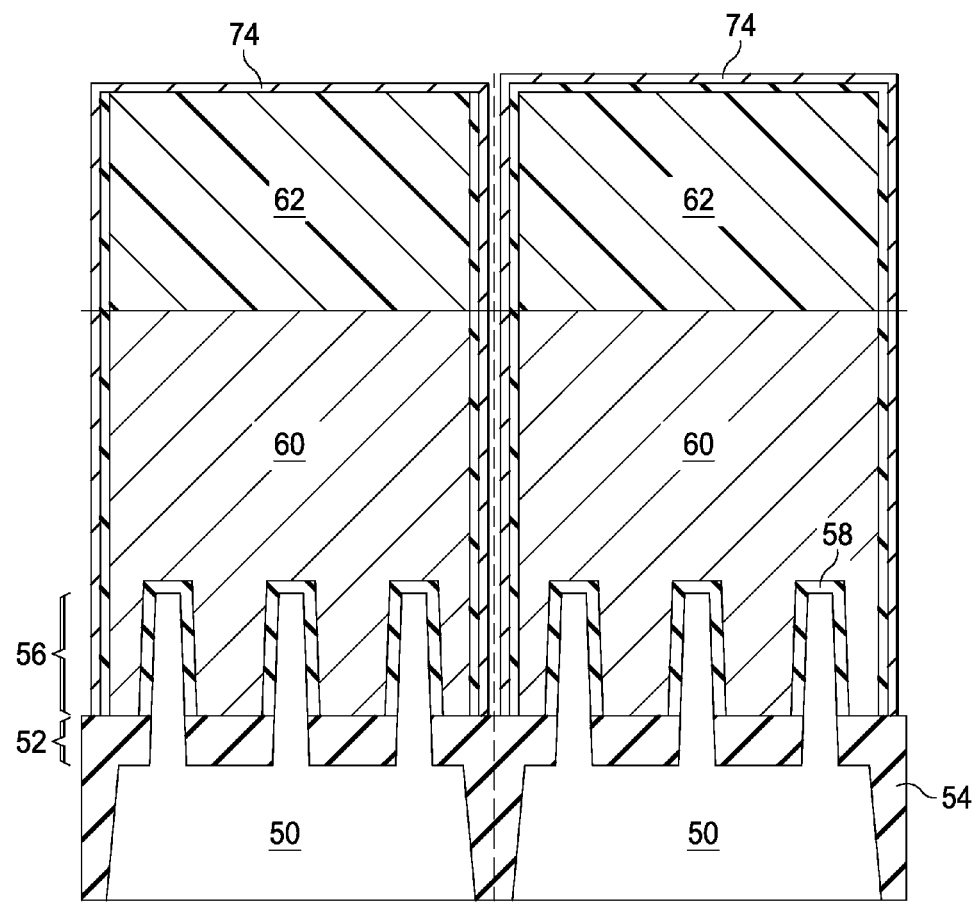
Figure 9C:
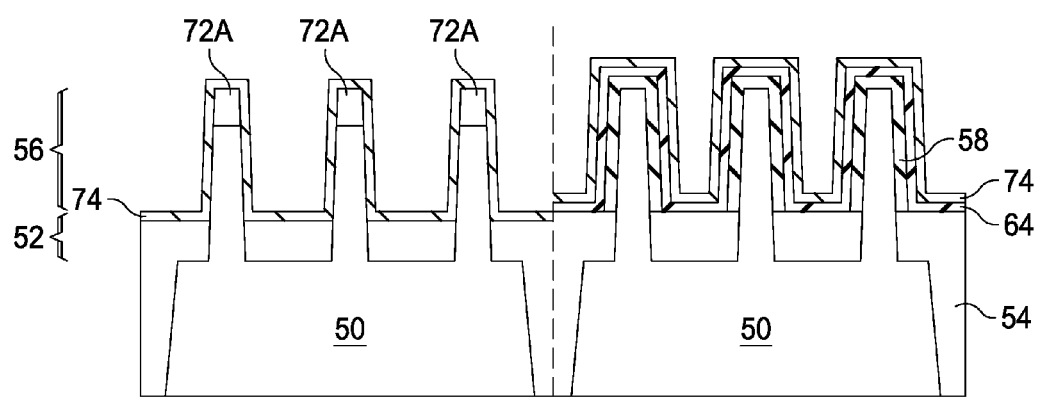

In FIGS. 9A, 9B, and 9C and step 218, a dopant source layer 74 is formed by a plasma deposition process. The plasma deposition process forms a conformal layer having a substantially uniform thickness on top surfaces and sidewalls of the fins 56 in the first region 50A and on the seal spacer layer 64 in the second region 50B of the substrate 50. In an embodiment, the plasma deposition process utilizes from about from about 15% to about 100% of $AsH_3$ or $PH_3$/He, and from about 85% to about 0% $H_2$. The thickness of the dopant source layer 74 may be in a range from about 1 nm to about 5 nm, although other thicknesses are also within the scope of the present disclosure.

In some embodiments, the dopant source layer 74 is formed of phosphosilicate glass (PSG) and/or other materials that comprise a dopant susceptible to subsequent diffusion into the fins 56. In these embodiments, the dopant source layer 74 may be formed by sputtering, CVD, PECVD, metal organic CVD (MOCVD), furnace CVD (FCVD), atomic layer deposition (ALD), plasma-enhanced ALD (PEALD), the like, or a combination thereof.

Although the plasma doping process 70 was performed before the plasma deposition process, the order of these processes could be reversed in other embodiments which are within the scope of the present disclosure.

Figure 10A:
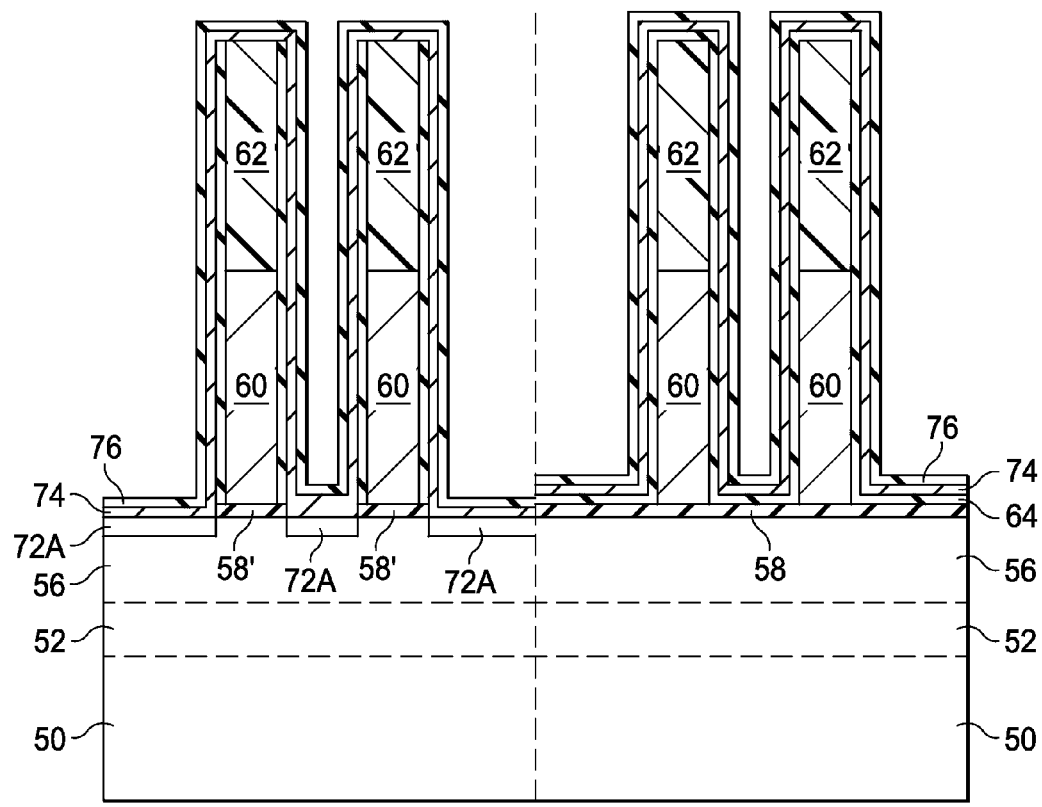
Figure 10B:
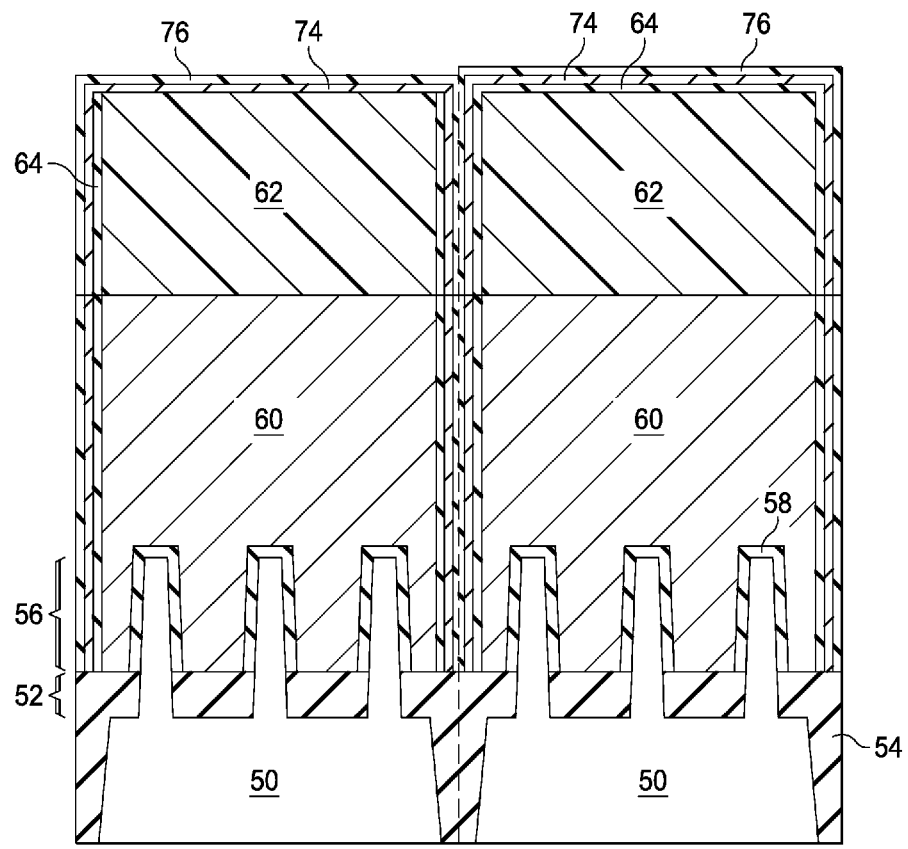
Figure 10C:
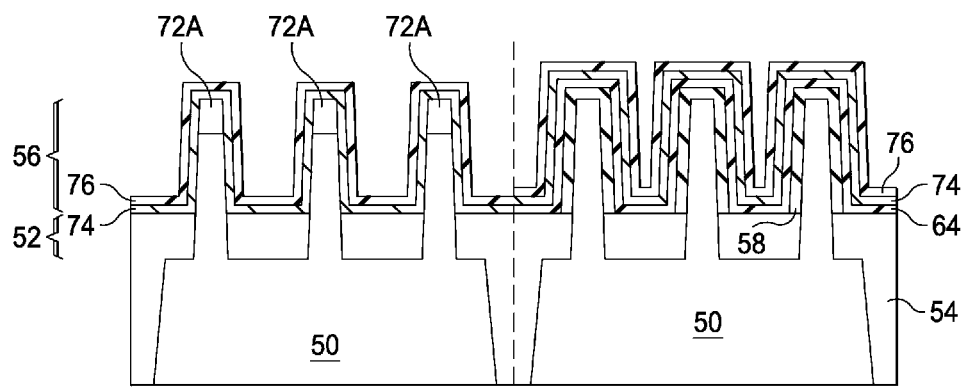

In FIGS. 10A, 10B, and 10C and step 220, a capping layer 76 is formed over the dopant source layer 74 in the first and second regions 50A and 50B of the substrate 50. The capping layer 76 helps to prevent the dopant source layer 74 from evaporating during the subsequent anneal process. In some embodiments, the capping layer 76 is formed of an oxide, such as $Al_2O_3$, a nitride, the like, or a combination thereof. The capping layer may be formed by sputtering, CVD, PECVD, MOCVD, FCVD, ALD, PEALD, the like, or a combination thereof.

Figure 11A:
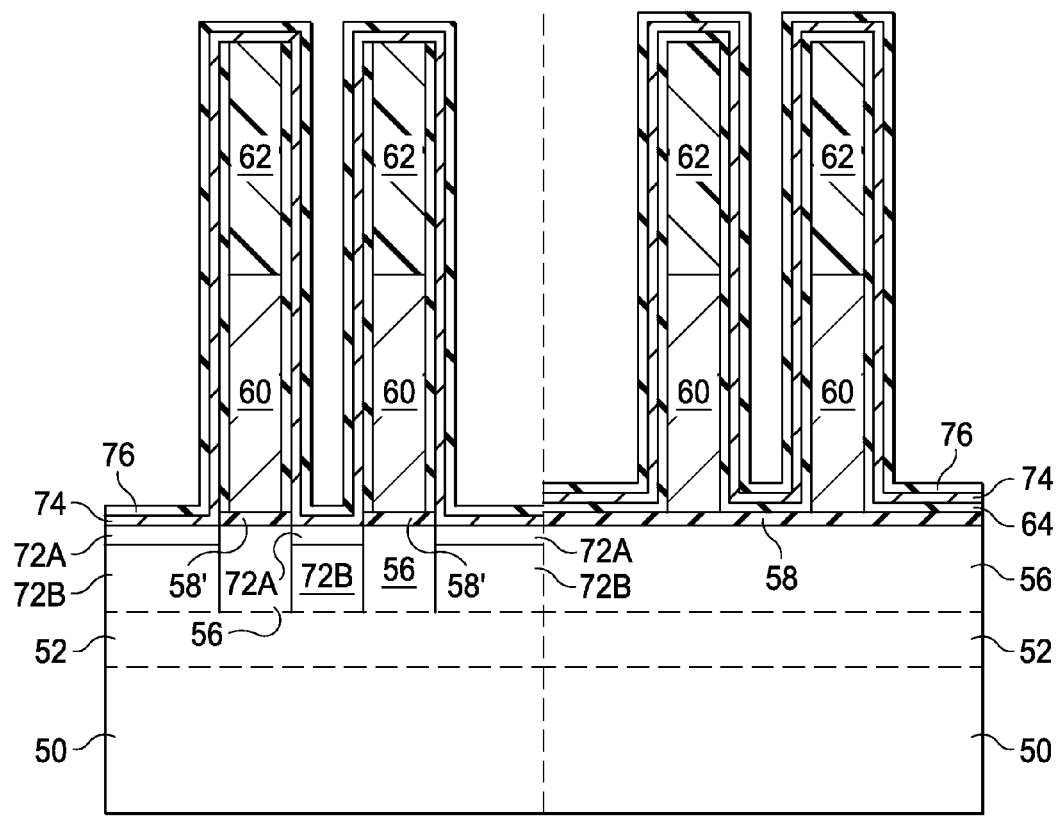
Figure 11B:
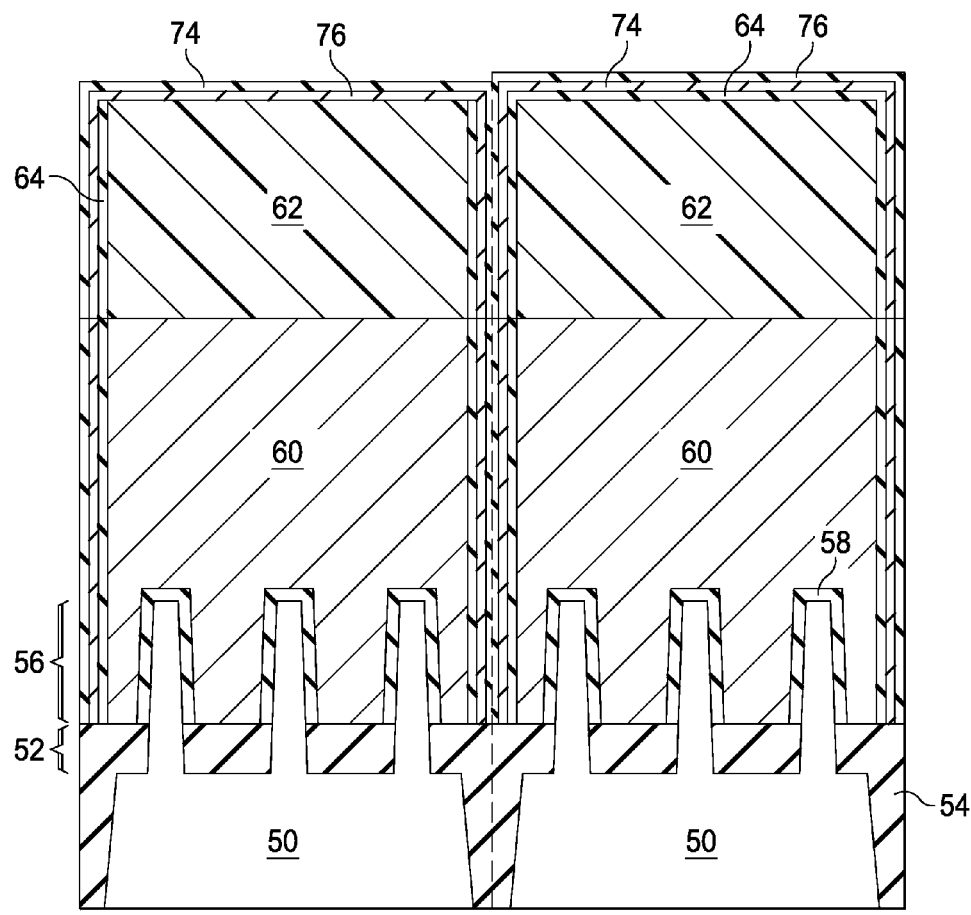
Figure 11C:
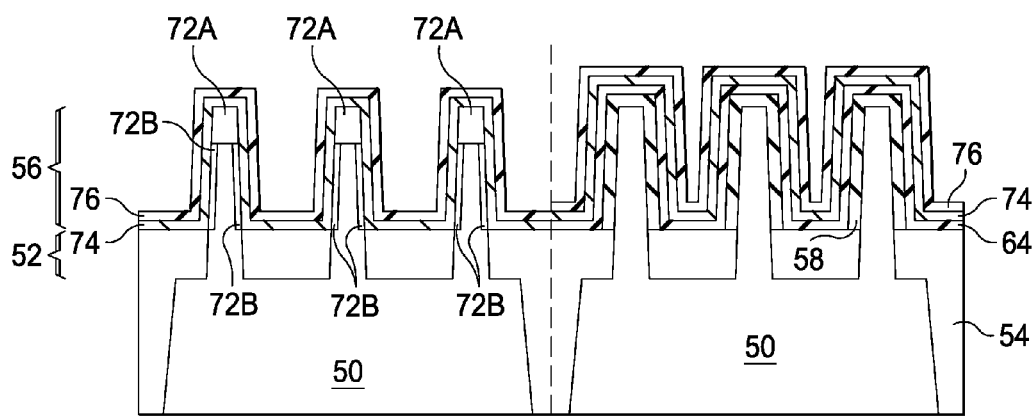

In step 222, an annealing process is performed on the substrate 50. FIGS. 11A, 11B, and 11C illustrate the substrate 50 after the annealing process. The annealing process diffuses the dopants from the dopant source layer 74 into the fins 56 and also activates the dopants in the first doped regions and the dopants from the dopant source layer 74 forming the second doped regions 72B in the fins 56 in the first region 50A of the substrate 50. The first doped regions 72A and the second doped regions 72B form an LDD region for the FinFET in the first region 50A of the substrate. The seal spacer layer 64 and the gate dielectric layer 58 in over the fins 56 in the second region 50B of the substrate 50 act as blocking layers so that the dopants from the dopant source layer 74 do not diffuse into the fins 56 in the second region 50B.

In the first region 50A of the substrate 50, the second doped regions 72B extend along the top portions (tips) and sidewalls of the fins 56 and provide a substantially uniform doping profile along the sidewalls of the fins 56. The second doped regions 72B may overlap the first doped regions 72A in the top portions (tips) of the fins 56. The second doped regions 72B have a dopant concentration of As/P in a range from about 5E19 atoms/cm$^3$ to about 2E20 atoms/cm$^3$. The second doped regions 72B can form an abrupt doping profile junction at a depth of from about 5 nm to about 10 nm from surfaces of the fin 56. Although FIG. 11C illustrates a portion of the fins 56 between second doped regions 72B, in some embodiments, the fins 56 are formed to have a width such that the second doped regions 72B along the sidewalls meet to uniformly dope the entire fin 56.

In some embodiments, the annealing process may include one or more annealing processes may be performed at this stage to affect the solid phase diffusion of dopant from the dopant source layer 74 into the fins 56. The one or more annealing processes may entail subjecting the substrate 50 to a temperature ranging between about 100° C. and about 1200° C. for a time period ranging between about 1 second and about 10 hours. However, other annealing parameters are also within the scope of present disclosure.

Figure 12A:
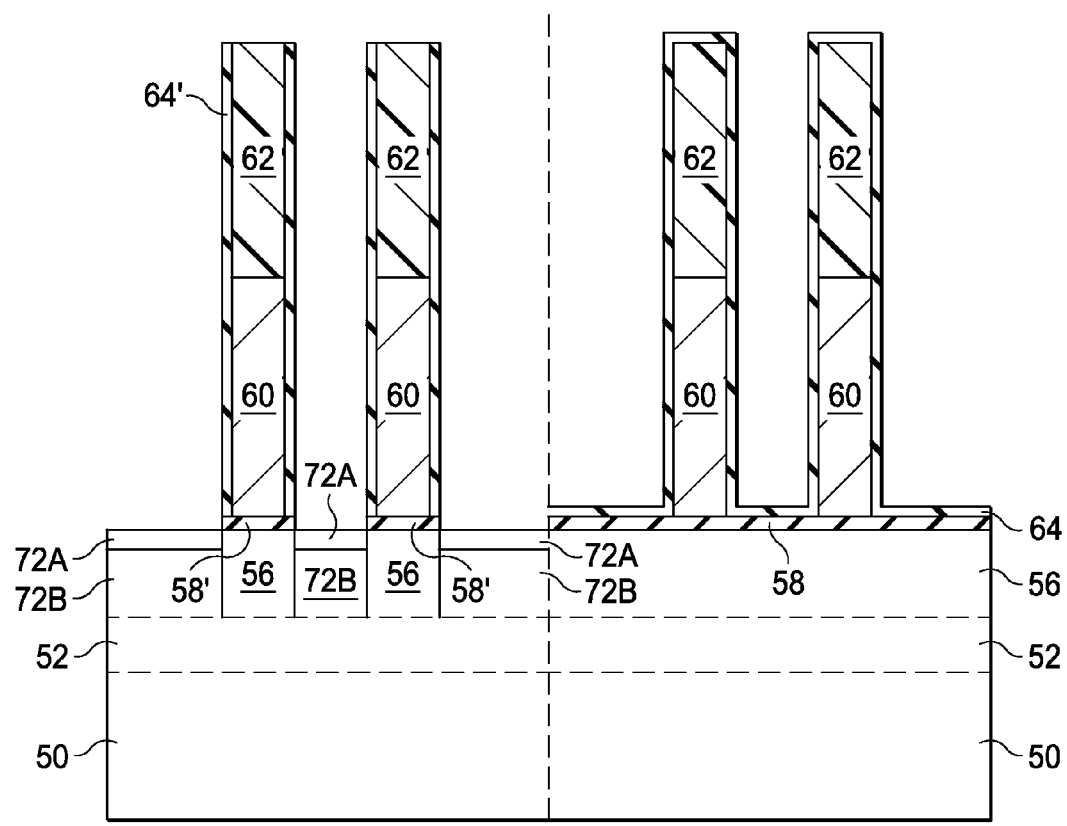
Figure 12B:
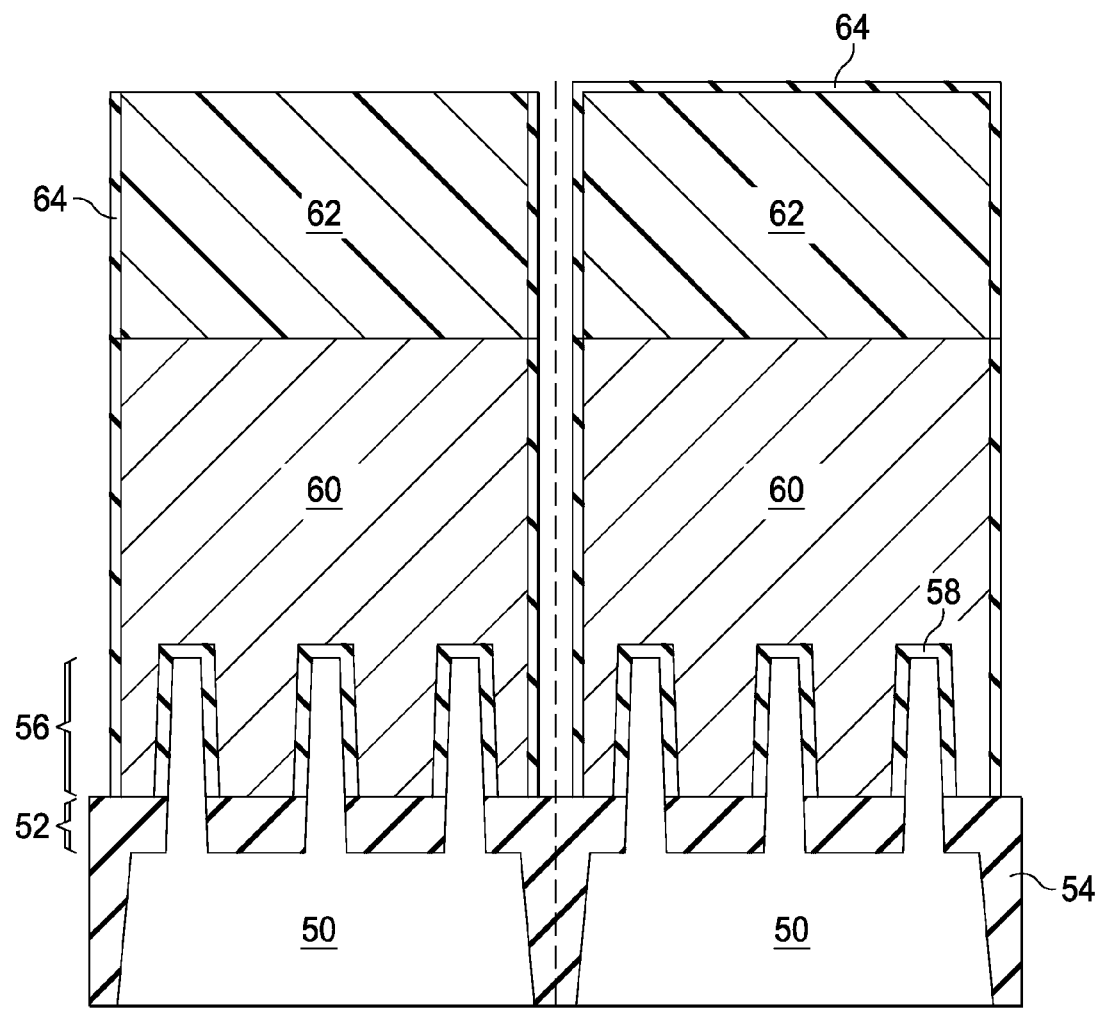
Figure 12C:
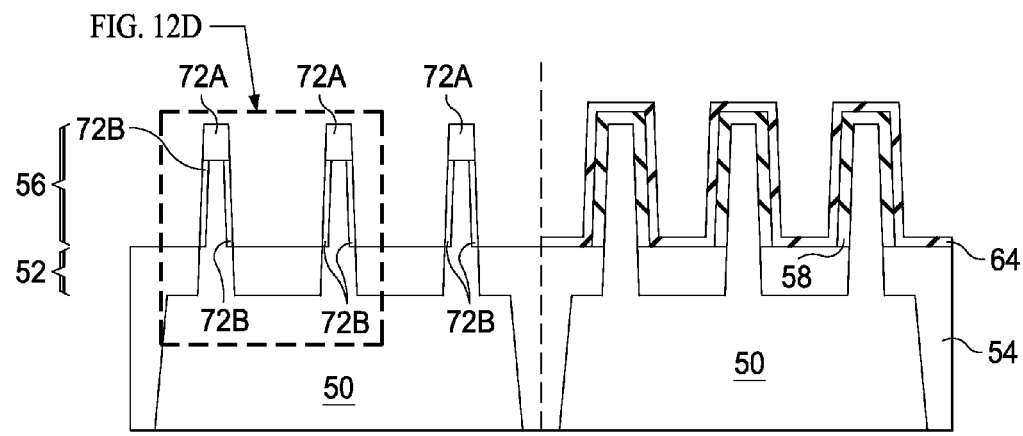
Figure 12D:
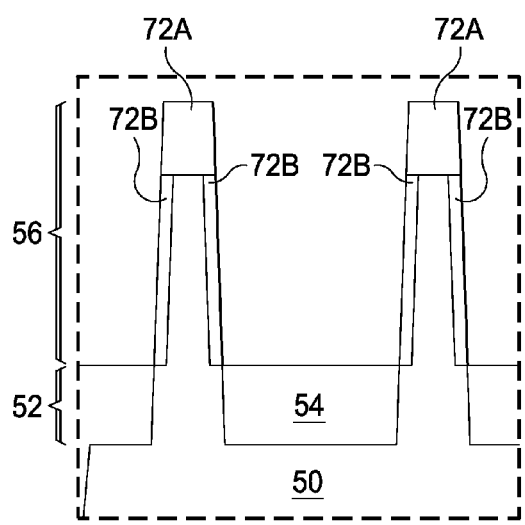

In FIGS. 12A, 12B, 12C, 12D and step 224, the capping layer 76 and the dopant source layer 74 are removed from the first and second regions 50A and 50B of the substrate 50. In some embodiments, the capping layer 76 and the dopant source layer 74 may be removed using an etch, a CMP process, the like, or a combination thereof. FIG. 12D illustrates a close-up view of the fins 56 and the first doped regions 72A and the second doped regions 72B from FIG. 12C. The first doped regions 72A are located in top portions (tips) of the fins 56 and the second doped regions 72B are located in the sidewalls of the fins 56.

By utilizing this hybrid fin doping technique (plasma doping process and plasma deposition process), the fins 56 have the desired fin LDD doping profile. The top portions (tips) of the fins 56 have the first doped regions 72A and are doped to a higher concentration than middle/bottom portions (sidewalls) of the fins 56 which include the second doped regions 72B. This doping profile is beneficial because the top portions of the fins 56 have higher carrier flow due to a lower threshold voltage because the top portions of the fins 56 are controlled by three gates (e.g. the gate electrode 60 is on three sides of top portions) and the middle/bottom portions of the fins 56 are controlled by two gates, and thus, have a slightly higher threshold voltage and slightly lower carrier flow.

Steps 226-242 perform similar processes on the second region 50B (e.g. p-type FinFET) of the substrate 50 as steps 208-224 did to the first region 50A (e.g. n-type FinFET) of the substrate 50. Details of these steps that are similar to those described above are not repeated herein.

In step 226, a mask is formed over the first region 50A of the substrate. This mask and step may be similar to the mask and step described above in step 208 and the description is not repeated herein.

In step 228, a selective implant is performed to implant dopants into the seal spacer layer 64 in the second region 50B of the substrate 50. This selective implant process and step may be similar to the selective implant process and step described above in step 210 and the description is not repeated herein.

In step 230, a selective etch is on the seal spacer layer 64 and the gate dielectric layer 58 in the second region 50B of the substrate 50. This selective etch process and step may be similar to the selective etch process and step described above in step 212 and the description is not repeated herein.

Figure 13A:
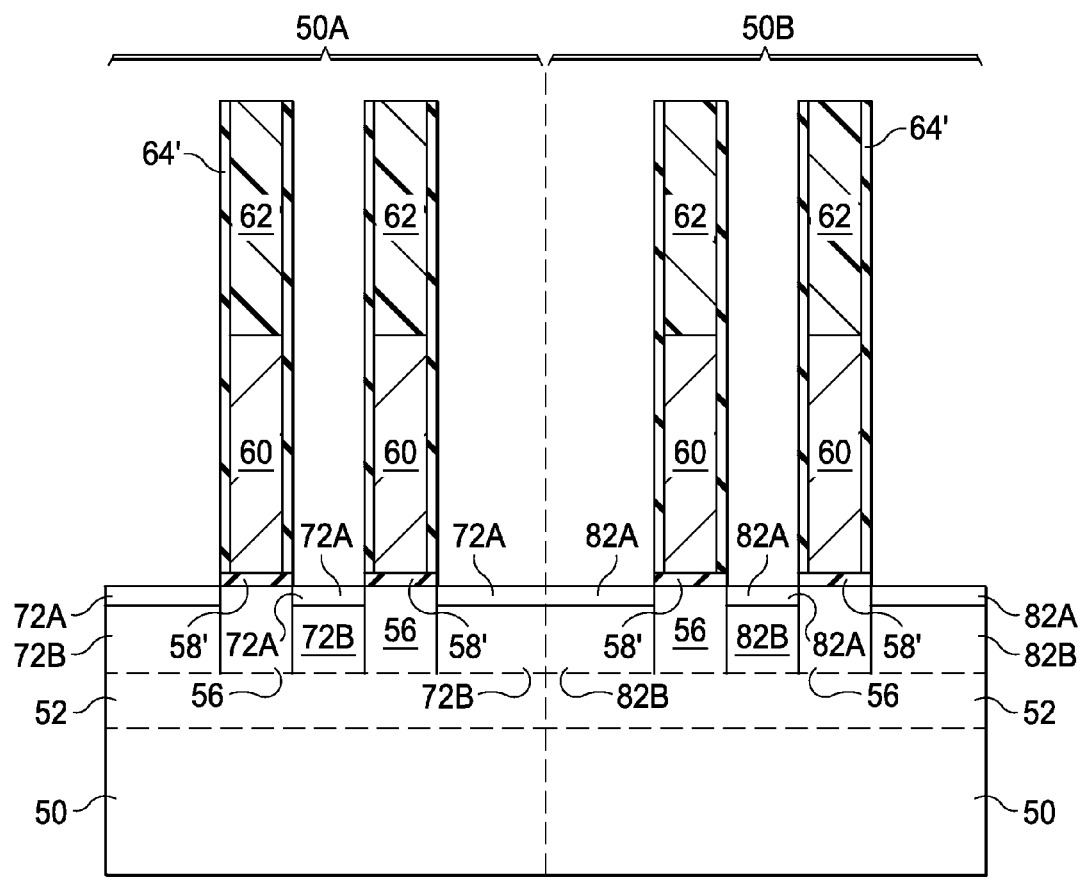
Figure 13B:
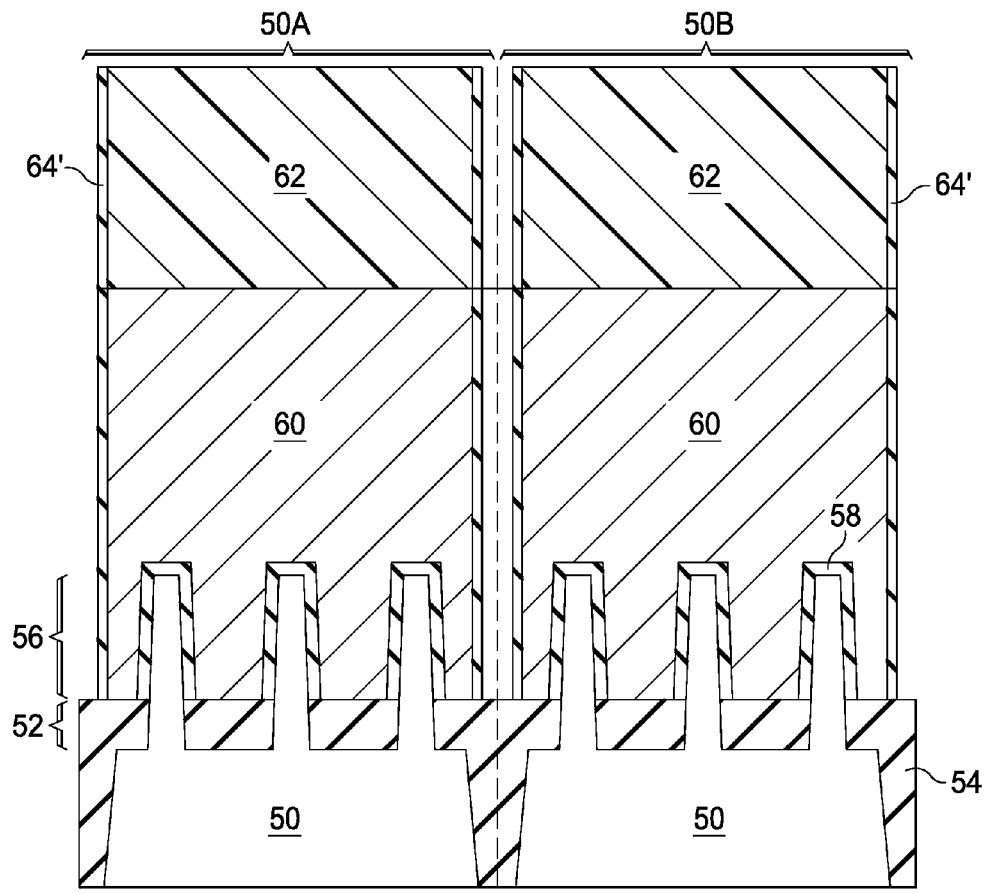
Figure 13C:
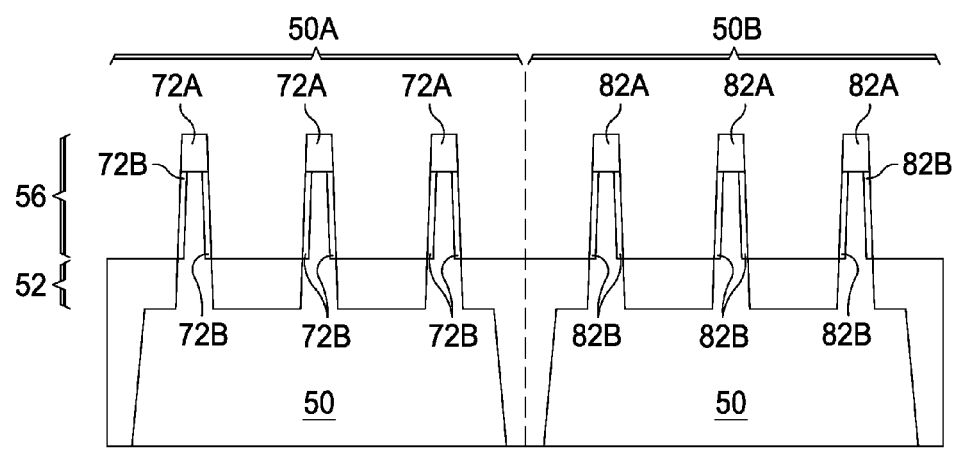

In step 232, a plasma doping process is performed on the second region 50B of the substrate 50 to form third doped regions 82A in the fins 56 (see FIGS. 13A, 13B, and 13C). The plasma doping process implants p-type dopants (e.g. B, Ga, etc.) to form LDD regions in the fins 56 of the second region 50B of the substrate 50. In an embodiment, the plasma doping process is performed in the second region 50B of the substrate 50 utilizes from about 0.1% to about 0.9% of $B_2H_6$ or $BF_3/H_2$, and from about 99.1% to about 99.9% He. In an embodiment, the plasma doping process is performed at a constant energy of between about 2 keV and about 5 keV. After the plasma doping process, the third doped regions 82A have a dopant concentration of B/Ga in a range from about 1E20 atoms/cm$^3$ to about 3E21 atoms/cm$^3$. The plasma doping process can form an abrupt doping profile junction at a depth of from about 5 nm to about 10 nm from surfaces of the fin 56 with a doping profile abruptness of about 1 nm/decade.

In step 234, the mask is removed from the first region 50A of the substrate 50. This mask removal process and step may be similar to the mask removal and step described above in step 216 and the description is not repeated herein.

In step 236, a dopant source layer is formed by a plasma deposition process. The plasma deposition process forms a conformal layer having a substantially uniform thickness on top surfaces and sidewalls of the fins 56 in the second region 50B and on the mask layer, if present, or other protective structure in the first region 50A of the substrate 50. In an embodiment, the plasma deposition process utilizes from about from about 15% to about 100% of $B_2H_6$ or $BF_3/H_2$, and from about 85% to about 0% He. The thickness of the dopant source layer may be in a range from about 1 nm to about 5 nm, although other thicknesses are also within the scope of the present disclosure.

In some embodiments, the dopant source layer is formed of BSG, and/or other materials that comprise a dopant susceptible to subsequent diffusion into the fins 56. In these embodiments, the dopant source layer may be formed by sputtering, CVD, PECVD, MOCVD, FCVD, ALD, PEALD, the like, or a combination thereof.

Although the plasma doping process was performed before the plasma deposition process, the order of these processes could be reversed in other embodiments which are within the scope of the present disclosure.

In step 238, a capping layer is formed over the dopant source layer in the second region 50B of the substrate 50. The capping layer and the step may be similar to the capping layer and step described above in step 220 and the description is not repeated herein.

In step 240, an anneal process is performed on the substrate 50. This annealing process diffuses the dopants from the dopant source layer into the fins 56 and also activates the dopants forming the fourth doped regions 82B in the fins 56 in the second region 50B of the substrate 50. This annealing process and step may be similar to the annealing process and step described above in step 222 and the description is not repeated herein.

In FIGS. 13A, 13B, 13C, and in step 242, the capping layer and dopant source layer are removed. This removal process and step may be similar to the removal process and step described above in step 224 and the description is not repeated herein.

In the second region 50B of the substrate 50, the fourth doped regions 82B extend along the top portions (tips) and sidewalls of the fins 56 and provide a substantially uniform doping profile along the sidewalls of the fins 56. The fourth doped regions 82B may overlap the third doped regions 82A in the top portions (tips) of the fins 56. The fourth doped regions 82B have a dopant concentration of B/Ga in a range from about 5E19 atoms/cm$^3$ to about 2E20 atoms/cm$^3$. The fourth doped regions 82B can form an abrupt doping profile junction at a depth of from about 5 nm to about 10 nm from surfaces of the fin 56. Although FIG. 13C illustrates a portion of the fins 56 between fourth doped regions 82B, in some embodiments, the fins 56 are formed to have a width such that the fourth doped regions 82B along the sidewalls meet to uniformly dope the entire fin 56.

Although not explicitly shown, a person having ordinary skill in the art will readily understand that further processing steps may be performed on the structure illustrated in FIGS. 13A. 13B. and 13C. For example, in step 244, gate spacers may be formed on sidewalls of the gate electrodes 60. The gate spacers (not shown) may be formed on opposite sides of the gate electrodes 60. The gate spacers may be formed by blanket depositing a spacer layer (not shown) on the previously formed structure. In an embodiment, the gate spacers may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD, sputter, and other methods known in the art. The gate spacers are then patterned, for example, by anisotropically etching to remove the spacer layer from the horizontal surfaces of the structure.

In step 246, source/drain regions may be formed in the fins 56. The source/drain regions (not shown in FIGS. 13A, 13B, and 13C, see source/drain regions 42 and 44 in FIG. 1) may be formed in the fins 56. The source/drain regions may be doped by with the appropriate dopants to complement the dopants in the fins 56. In another embodiment, the source/drain regions may be formed by forming recesses in the fins 56 and epitaxially growing material in the recesses. The source/drain regions may be doped either through an implantation method as discussed above, or else by in-situ doping as the material is grown.

The source/drain regions may comprise and a heavily doped region in addition to the LDD regions discussed above. In this embodiment, after the LDD regions and the gate spacers are formed, the source/drain regions may then be heavily doped. This forms LDD regions and heavily doped regions. The LDD regions are primarily underneath the gate spacers while the heavily doped regions are outside of the gate spacers along the fins 56. In some embodiments, the fins 56 include an anti-punch through region (not shown). This anti-punch through region prevents the short channel effect of electrons or holes punching through the channel from the source to the drain. The anti-punch through region may be doped the same as the fin 56 but with a higher dopant concentration.

Further, in step 248, an etch stop layer (ESL) and an inter-layer dielectric (ILD) may be formed over and adjoining the gate electrodes 60 and fins 56. The ESL and the ILD may be formed over the gate spacers, the gate electrodes 60, the source/drain regions, the fins 56, and the STI regions 54. The ESL may be conformally deposited over components on the substrate 50. In an embodiment, the ESL is formed of SiN, SiCN, SiON, the like, or a combination thereof and is formed by ALD, molecular layer deposition (MLD), a furnace process, CVD, PECVD, the like, or a combination thereof.

After the ESL is formed, the ILD may be formed over the ESL. The ILD may be conformally deposited over the ESL. In an embodiment, the ILD may comprise SiO$_2$, SiON, the like, or a combination thereof. The ILD may be formed by CVD, ALD, PECVD, subatmospheric CVD (SACVD), flowable CVD, a high density plasma (HDP), a spin-on-dielectric process, the like, or a combination thereof.

The ILD may be planarized by using a CMP process to remove portions of the ILD. In other embodiments, other planarization techniques may be used, such as etching.

In optional step 250, the dummy gate and gate dielectric may be removed. In gate-last or replacement-gate processes, the gate electrode 60 and the gate dielectric 58' are removed. In optional step 252, an active gate and gate dielectric is formed in the place of the removed gate electrode and gate dielectric.

In step 254, contacts and inter-metal dielectrics (IMD) and their corresponding metallizations may be formed through the ESL and ILD to the fins 56 and the gate electrodes 60. The contacts may be formed to the gate electrodes 60 and the source/drain regions.

Figure 15C:
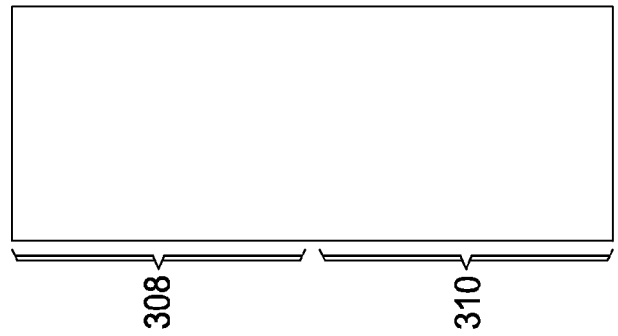
FIGS. 15A-C are doping profiles of structures in accordance with some embodiments.
Figure 15B:
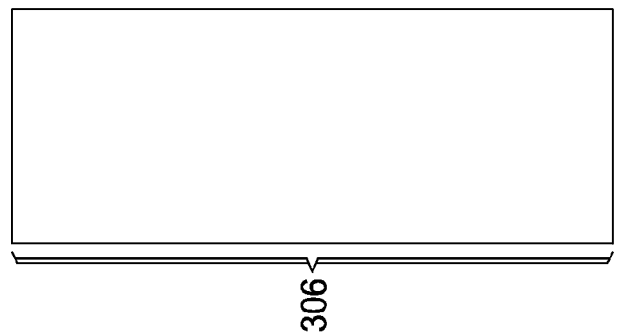
Figure 15A:
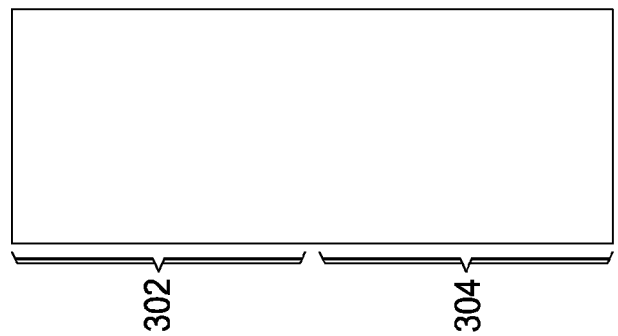

FIGS. 15A, 15B, and 15C are doping profiles of structures in accordance with some embodiments. FIG. 15A illustrates the doping profile of the fins 56 after the plasma doping process in steps 214 and 232 but without the plasma deposition process and annealing process. In FIG. 15A, a semiconductor structure 300 is shown with an upper region 302 and a lower region 304. The upper region 302 has a high dopant concentration and the lower region 304 has no doping concentration or almost zero doping concentration. For example, the upper region 302 has a dopant concentration of B, Ga, As, P, the like, or a combination thereof in a range from about 1E20 atoms/cm$^3$ to about 3E21 atoms/cm$^3$ and the lower region is non-doped. As illustrated, the plasma doping process forms an abrupt junction (at the interface between the upper region 302 and the lower region 304) in the doping profile.

FIG. 15B illustrates the doping profile of the fins 56 after the plasma deposition process and annealing process 218-222 and 236-240 but without the plasma doping process. In FIG. 15B, the semiconductor structure 300 is shown with single region 306. The region 306 has a uniform doping profile, but typically a lower dopant concentration than a region doped by a plasma doping process. For example, the region 306 has a dopant concentration of B, Ga, As, P, the like, or a combination thereof in a range from about 5E19 atoms/cm$^3$ to about 2E20 atoms/cm$^3$.

FIG. 15C illustrates the doping profile of the fins 56 after the plasma doping process in steps 214 and 232 and the plasma deposition process and annealing process 218-222 and 236-240. In FIG. 15C, the semiconductor structure 300 is shown with an upper region 308 and a lower region 310. The upper region 308 has a high dopant concentration and the lower region 304 has a lower dopant concentration. For example, the upper region 302 has a dopant concentration of B, Ga, As, P, the like, or a combination thereof in a range from about 1E20 atoms/cm$^3$ to about 3E21 atoms/cm$^3$ and the lower region has a dopant concentration of B, Ga, As, P, the like, or a combination thereof in a range from about 5E19 atoms/cm$^3$ to about 2E20 atoms/cm$^3$. In some embodiments, the dopant concentration of the upper region 308 is determined by the plasma doping process and the dopant concentration of the lower region is determined by the plasma deposition/annealing processes. This hybrid doping technique provides a high dopant concentration at the top portions of the fins 56 while providing a uniform dopant concentration in the middle/bottom portions of the fins 56.

By utilizing this hybrid fin doping technique (plasma doping process and plasma deposition process), the fins 56 have the desired fin LDD doping profile. In the first region 50A of the substrate 50, the top portions (tips) of the fins 56 have the first doped regions 72A and are doped to a higher concentration than middle/bottom portions (sidewalls) of the fins 56 which include the second doped regions 72B. In the second region 50B of the substrate 50, the top portions (tips) of the fins 56 have the third doped regions 82A and are doped to a higher concentration than middle/bottom portions (sidewalls) of the fins 56 which include the fourth doped regions 82B. This doping profile is beneficial because the top portions of the fins 56 have higher carrier flow due to a lower threshold voltage because the top portions of the fins 56 are controlled by three gates (e.g. the gate electrode 60 is on three sides of top portions) and the middle/bottom portions of the fins 56 are controlled by two gates, and thus, have a slightly higher threshold voltage and slightly lower carrier flow. In addition, the hybrid doping technique does not use beam line implant process, and thus, prevents the defects (e.g. twin boundary defects) caused by beam line implant processes. Furthermore, because the middle/bottom portions of the fins are not doped with an implant process, there is no implant shadowing effects that result in low doping or no doping towards the bottom of the fins.

An embodiment is a method including forming a fin on a substrate, forming a first doped region in a top portion of the fin, the first doped region having a first dopant concentration, and forming a second doped region in a middle and bottom portion of the fin, the second doped region having a second dopant concentration, the second dopant concentration being less than the first dopant concentration.

Another embodiment is a method including forming a first set of fins and a second set of fins on a substrate, the first set of fins being in a first region of the substrate, and the second set of fins being in a second region of the substrate, forming a first gate over the first set of fins and a second gate over the second set of fins, forming a first mask over the second region of the substrate, and performing a first plasma doping process on the first set of fins to form first doped regions in top portions of the first set of fins. The method further includes removing the first mask over the second region of the substrate, forming a first dopant source layer on top surfaces and sidewalls of the first set of fins, forming a first capping layer over the first dopant source layer, and annealing the first set of fins to form second doped regions along the sidewalls of the first set of fins.

A further embodiment is a structure including a fin on a substrate, the fin comprising an upper portion and a lower portion, the upper portion having a first dopant concentration of a first dopant, the lower portion having a second dopant concentration of the first dopant, the first dopant concentration being greater than the second dopant concentration, isolation regions in the substrate and on opposing sides of the fin, the upper and lower portion of the fin protruding from between the isolation regions, and a gate structure along sidewalls and over a top surface of the fin, the gate structure defining a channel region in the fin, the upper portion and the lower portion of the fin being adjacent the channel region in the fin.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a fin on a substrate;
   forming a first doped region in a top portion of the fin by a zero degree implantation process, the first doped region having a first dopant concentration;
   forming a second doped region in a middle and bottom portion of the fin based on a deposited dopant source layer, the second doped region having a second dopant concentration, the second dopant concentration being less than the first dopant concentration; and
   doping the first doped region with dopant from the dopant source layer.

2. The method of claim 1, wherein the forming the first doped region further comprises performing a plasma doping process on the fin.

3. The method of claim 2, wherein the performing the plasma doping process utilizes from about 0.1% to about 0.9% of $AsH_3$ or $PH_3$/He, and from about 99.1% to about 99.9% $H_2$.

4. The method of claim 2, wherein the performing the plasma doping process utilizes from about 0.1% to about 0.9% of $B_2H_6$ or $BF_3/H_2$, and from about 99.1% to about 99.9% He.

5. The method of claim 1, wherein the forming the second doped region further comprises:
   depositing a conformal dopant source layer on a top surface and sidewalls of the fin, the dopant source layer being separate from the fin;
   forming a capping layer over the dopant source layer; and
   annealing the fin, the annealing process diffusing dopants from the dopant source layer into the fin.

6. The method of claim 5, wherein the forming the dopant source layer further comprises performing a plasma deposition process on the fin.

7. The method of claim 1, wherein the first dopant concentration is in a range from about 1E20 atoms/cm$^3$ to about 3E21 atoms/cm$^3$ and the second dopant concentration is in a range from about 5E19 atoms/cm$^3$ to about 2E20 atoms/cm$^3$.

8. The method of claim 1, wherein the second doped region extends along sidewalls of the fin, the first and second doped regions forming lightly doped drain (LDD) regions in source and drain regions of the fin.

9. The method of claim 1 further comprising:
   forming a gate structure over the fin; and
   forming source/drain regions in the fin on opposing sides of the gate structure, the first doped region and the second doped region being in the source/drain regions.

10. A method comprising:
    forming a first set of fins and a second set of fins on a substrate, the first set of fins being in a first region of the substrate, and the second set of fins being in a second region of the substrate;
    forming a first gate over the first set of fins and a second gate over the second set of fins;
    forming a first mask over the second region of the substrate;
    performing a first plasma doping process on the first set of fins to form first doped regions in top portions of the first set of fins;
    removing the first mask over the second region of the substrate;

forming a first dopant source layer on top surfaces and sidewalls of the first set of fins;

forming a first capping layer over the first dopant source layer; and while the first capping layer remains, annealing the first set of fins to form second doped regions along the sidewalls of the first set of fins.

11. The method of claim 10, wherein the performing the first plasma doping process on the first set of fins is performed before the forming the first dopant source layer on the top surfaces and sidewalls of the first set of fins.

12. The method of claim 10, wherein the first doped regions and second doped regions each comprise a first dopant, the first doped regions having a higher concentration of the first dopant than the second doped regions.

13. The method of claim 10 further comprising:
before the forming the first mask over the second region of the substrate, forming a seal spacer layer over the first set of fins and the second set of fins; and
after the forming the first mask over the second region of the substrate, patterning the seal spacer layer in the first region of the substrate to form seal spacers on sidewalls of the first set of fins.

14. The method of claim 13, wherein the seal spacer layer over the second set of fins blocks the formation of doped regions in the second set of fins during the step of annealing the first set of fins.

15. The method of claim 10 further comprising:
after the annealing the first set of fins, removing the first capping layer and the first dopant source layer.

16. The method of claim 10 further comprising:
after the annealing the first set of fins:
 forming a second mask over the first region of the substrate;
 performing a second plasma doping process on the second set of fins to form third doped regions in top portions of the second set of fins;
 removing the second mask over the first region of the substrate;
 forming a second dopant source layer on top surfaces and sidewalls of the second set of fins;
 forming a second capping layer over the second dopant source layer; and
 annealing the second set of fins to form fourth doped regions along the sidewalls of the second set of fins.

17. A method comprising:
forming a first fin and a second fin on a substrate, the first fin being in a first region of the substrate, and the second fin being in a second region of the substrate;
forming a first gate over the first fin and a second gate over the second fin;
forming a first mask over the second region of the substrate;
performing a first plasma doping process on the first fin to form first doped regions in top portions of the first fin, the first doped regions comprising a first dopant;
removing the first mask over the second region of the substrate;
forming a first dopant source layer on a top surface and sidewalls of the first fin;
forming a first capping layer over the first dopant source layer; and
without removing the first capping layer, annealing the first fin to form second doped regions along the sidewalls of the first fin, the first doped regions and the second doped regions comprising the first dopant from the first dopant source layer, the first doped regions having a higher concentration of the first dopant than the second doped regions.

18. The method of claim 17 further comprising:
after the annealing the first fin:
 forming a second mask over the first region of the substrate;
 performing a second plasma doping process on the second fin to form third doped regions in top portions of the second fin;
 removing the second mask over the first region of the substrate;
 forming a second dopant source layer on a top surface and sidewalls of the second fin;
 forming a second capping layer over the second dopant source layer; and
 annealing the second fin to form fourth doped regions along the sidewalls of the second fin.

19. The method of claim 17 further comprising:
after the annealing the first fin, removing the first capping layer and the first dopant source layer.

20. The method of claim 17 further comprising:
before the forming the first mask over the second region of the substrate, forming a seal spacer layer over the first fin and the second fin; and
after the forming the first mask over the second region of the substrate, patterning the seal spacer layer in the first region of the substrate to form seal spacers on sidewalls of the first fin.

* * * * *